US012615324B2

(12) United States Patent
Jang et al.

(10) Patent No.: US 12,615,324 B2
(45) Date of Patent: Apr. 28, 2026

(54) ELECTRONIC DEVICE INCLUDING ANTENNA

(71) Applicant: SAMSUNG ELECTRONICS CO., LTD., Suwon-si (KR)

(72) Inventors: Kyihyun Jang, Suwon-si (KR); Gyusub Kim, Suwon-si (KR); Kyungmoon Seol, Suwon-si (KR); Bumjin Cho, Suwon-si (KR); Seongyong An, Suwon-si (KR); Chankyu An, Suwon-si (KR); Jaebong Chun, Suwon-si (KR); Nakchung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 588 days.

(21) Appl. No.: 18/083,864

(22) Filed: Dec. 19, 2022

(65) Prior Publication Data

US 2023/0208950 A1 Jun. 29, 2023

Related U.S. Application Data

(63) Continuation of application No. PCT/KR2022/016512, filed on Oct. 26, 2022.

(30) Foreign Application Priority Data

Dec. 24, 2021 (KR) ........................ 10-2021-0187829
Mar. 7, 2022 (KR) ........................ 10-2022-0029008

(51) Int. Cl.
*H04M 1/02* (2006.01)
*H01Q 1/24* (2006.01)
(Continued)

(52) U.S. Cl.
CPC ............ *H04M 1/026* (2013.01); *H01Q 1/243* (2013.01); *H01Q 9/0442* (2013.01); *H03H 7/38* (2013.01)

(58) Field of Classification Search
CPC .......... G09F 9/30; H01Q 1/243; H01Q 21/28; H01Q 5/328; H01Q 5/335; H01Q 9/0421;
(Continued)

(56) References Cited

U.S. PATENT DOCUMENTS 9,343,802 B2 5/2016 Su et al.
10,116,346 B2 10/2018 Kim et al.
(Continued)

FOREIGN PATENT DOCUMENTS

JP 4413145 2/2010
KR 10-2006-0056456 5/2006
(Continued)

OTHER PUBLICATIONS

Extended Search Report dated Feb. 11, 2025 in European Patent Application No. 22911577.9.
(Continued)

*Primary Examiner* — Nader Bolourchi
(74) *Attorney, Agent, or Firm* — Nixon & Vanderhye, P.C.

(57) ABSTRACT

An electronic device includes a first housing, a second housing, a supporting member, at least one slit, and at least one processor. The second housing includes a plurality of conductive portions and a plurality of non-conductive portions. At least one processor is configured to communicate with an external electronic device through the housing and the at least one conductive portion acting as an antenna in a first state in which the second housing is slid in the first housing and communicate with the external electronic device through the at least one conductive portion acting as
(Continued)

327: 327a, 327b, 327c
329: 329a, 329b, 329c, 329d
340: 341, 343, 345 an antenna in a second state in which the second housing is slid out the first housing.

20 Claims, 29 Drawing Sheets

(51) Int. Cl.
      *H01Q 9/04*         (2006.01)
      *H03H 7/38*         (2006.01)

(58) Field of Classification Search
      CPC .......... H01Q 9/0442; H01Q 9/42; H03H 7/38;
                                H04M 1/0235; H04M 1/026
      See application file for complete search history.

(56) References Cited

U.S. PATENT DOCUMENTS

| | | | | |
|---|---|---|---|---|
| 10,551,542 | B1 * | 2/2020 | Tan | ...................... G02B 6/0006 |
| 11,056,768 | B2 | 7/2021 | Kim et al. | |
| 11,411,592 | B2 | 8/2022 | Lee et al. | |
| 11,800,667 | B2 | 10/2023 | Oh et al. | |
| 11,895,788 | B2 | 2/2024 | Jung et al. | |
| 2015/0303557 | A1 * | 10/2015 | Kim | ......................... H01Q 1/44 |
| 2018/0287246 | A1 * | 10/2018 | Kim | ......................... H01Q 9/42 |
| 2018/0366813 | A1 * | 12/2018 | Kim | ......................... H01Q 9/04 |
| 2020/0350939 | A1 * | 11/2020 | Lee | ......................... H01Q 5/378 |
| 2021/0219437 | A1 | 7/2021 | Kim et al. | |
| 2021/0235109 | A1 | 7/2021 | Liu et al. | |
| 2022/0053653 | A1 * | 2/2022 | Jung | ........................ H01Q 5/40 |
| 2022/0061175 | A1 * | 2/2022 | Oh | ......................... H01Q 21/28 |
| 2022/0115772 | A1 | 4/2022 | Kim et al. | |

FOREIGN PATENT DOCUMENTS

| | | |
|---|---|---|
| KR | 100811849 | 3/2008 |
| KR | 10-2017-0037464 | 4/2017 |
| KR | 10-2017-0066944 | 6/2017 |
| KR | 10-2019-0143029 | 12/2019 |
| KR | 10-2143103 | 8/2020 |
| KR | 10-2020-0121518 | 10/2020 |
| KR | 10-2259104 | 6/2021 |
| KR | 10-2295237 | 8/2021 |
| KR | 102585017 | 10/2023 |
| WO | 2020123456 A1 | 6/2020 |

OTHER PUBLICATIONS

Search Report dated Feb. 2, 2023 in International Patent Application No. PCT/KR2022/016512.
Written Opinion dated Feb. 2, 2023 in International Patent Application No. PCT/KR2022/016512.
First Examination Report dated Mar. 5, 2026 in Indian Application No. 202417047681 and English-language translation.

* cited by examiner

310: 311, 313
320: 323, 325

327: 327a, 327b, 327c
329: 329a, 329b, 329c, 329d
340: 341, 343, 345

327: 327a, 327b, 327c
329: 329a, 329b, 329c, 329d
340: 341, 343, 345

327: 327a, 327b, 327c
329: 329a, 329b, 329c, 329d
340: 341, 343, 345

327: 327a, 327b, 327c
329: 329a, 329b, 329c, 329d
340: 341, 343, 345

327: 327a, 327b, 327c
329: 329a, 329b, 329c, 329d
340: 341, 343, 345

327: 327a, 327b, 327c
329: 329a, 329c, 329d, 329e, 329f
340: 341, 343, 345

810

SENSING STATE OF ELECTRONIC DEVICE

820

WHETHER STATE OF
ELECTRONIC DEVICE IS FIRST STATE?

NO

YES

830

COMMUNICATE WITH EXTERNAL
ELECTRONIC DEVICE BASED ON
RESONANT FREQUENCY SET
AS FIRST FREQUENCY THROUGH
ANTENNA IN FIRST STATE

840

COMMUNICATE WITH EXTERNAL
ELECTRONIC DEVICE BASED ON
RESONANT FREQUENCY SET
AS SECOND FREQUENCY THROUGH
ANTENNA IN SECOND STATE

A1: A1a, A1b
327: 327a, 327b, 327c
329: 329a, 329b, 329c, 329d
340: 341, 343, 345

A2: A2a, A2b
327: 327a, 327b, 327c
329: 329a, 329b, 329c, 329d
340: 341, 343, 345

A1: Aa, Ab
327: 327a, 327b, 327c
329: 329a, 329b, 329c, 329d
340: 341, 343, 345

A1: Aa, Ab
327: 327a, 327b, 327c
329: 329a, 329b, 329c, 329d
340: 341, 343, 345

327: 327a, 327b, 327c
329: 329a, 329b, 329c, 329d
340: 341, 343, 345

ELECTRONIC DEVICE INCLUDING ANTENNA

CROSS-REFERENCE TO RELATED APPLICATIONS

This application is a continuation of PCT/KR2022/016512, filed on Oct. 26, 2022, at the Korean Intellectual Property Receiving Office and claims priority under 35 U.S.C. § 119 to Korean Patent Application No. 10-2021-0187829, filed on Dec. 24, 2021 at the Korean Intellectual Property Office and to Korean Patent Application No. 10-2022-0029008, filed on Mar. 7, 2022 at the Korean Intellectual Property Office, the disclosures of each which are incorporated by reference herein in their entireties.

BACKGROUND

Field

The disclosure relates to an electronic device including an antenna.

Description of Related Art

An electronic device may transmit a signal through an antenna or receive a signal through the antenna. The electronic device may include a conductive region filled with a conductive material in a portion of the outer periphery of a housing. The conductive region may operate as an antenna radiator for transmitting and/or receiving a radio signal by being fed power from a wireless communication module.

As a size of the housing of the electronic device is miniaturized, an internal space of the electronic device may be reduced. It may be required to arrange various electronic components in the limited internal space of the electronic device.

SUMMARY

Users may prefer an electronic device having a small size housing that is easy to carry. The electronic device may include a large-sized display to provide a large screen to a user while the size of the housing is miniaturized. The electronic device may be designed as a rollable structure including a slidable housing in order to simultaneously satisfy a demand for a small-sized housing and a large-sized display. The electronic device having a rollable structure may adjust the size of the housing and the size of the display region of the display.

Since the size of the housing of the electronic device is miniaturized, the design for the length of the antenna disposed in the electronic device may be limited. For example, in the case of an electronic device having a rollable structure that can slide in one direction, in a slide-in state, since the entire length of a housing is reduced, it may be difficult to design an antenna that resonates in a low band (e.g., a frequency band of about 1 GHz or less). In a slide-out state, since the entire length of the housing is expanded, an antenna included in the electronic device having the rollable structure needs to be designed in consideration of a state of the electronic device.

In the electronic device having the rollable structure, various embodiments of the present disclosure may secure radiation performance regardless of the state of the housing by distinguishing an antenna structure according to a state of the electronic device.

The technical problems to be achieved in this document are not limited to those described above, and other technical problems not mentioned herein will be clearly understood by those having ordinary knowledge in the art to which the present disclosure belongs, from the following description.

According to an embodiment, an electronic device may comprise a first housing, a second housing, a supporting member, at least one slit, and at least one processor.

The first housing may include a conductive material, and may include a first cover plate and a first side member disposed along a portion of a circumference of the first cover plate.

The second housing may be coupled to the first housing to be slidable into the first housing or slidable out from the first housing in a first direction.

The second housing may include a feeding point disposed on at least one conductive portion of a plurality of conductive portions. A second side member may be disposed along a circumference of a second cover plate. The second side member may include the plurality of conductive portions and a plurality of non-conductive portions. The plurality of non-conductive portions may be disposed between the plurality of conductive portions. The feeding point may be disposed on at least one conductive portion of the plurality of conductive portions.

The supporting member may be positioned inside the second housing.

The at least one slit may be disposed on the supporting member.

The at least one processor may be configured to communicate with an external electronic device through the first housing and the at least one conductive portion acting as an antenna in a first state in which the second housing is slid into the first housing. The at least one processor may be configured to communicate with the external electronic device through the at least one conductive portion acting as an antenna in a second state in which the second housing is slid out from the first housing.

According to an embodiment, an electronic device may include a first housing, a second housing, a supporting member, a first conductive portion, a first slit, a sensor, an impedance matching circuit, and at least one processor.

The first housing may include a conductive material.

The second housing may include a second cover plate and a side member. The second housing may be slidably coupled to the first housing in a first direction. The side member may be disposed along a circumference of the second cover plate.

The supporting member may be positioned inside the second housing.

The first conductive portion may be formed along at least a portion of the side member extending in the first direction.

The first slit may be adjacent to the first conductive portion in the supporting member.

The sensor may output a signal related to the state of the electronic device.

The impedance matching circuit may be electrically connected to the first conductive portion.

The at least one processor may be operatively coupled to the impedance matching circuit and the sensor.

The at least one processor may be configured to communicate with an external electronic device, based on a resonant frequency set as a first frequency, through the first conductive portion and the first housing acting as an antenna in a first state, in response to identifying the first state in which the second housing is slid into the first housing, by the sensor. The at least one processor may be configured to communicate with the external electronic device, based on the resonant frequency set as a second frequency, through the first conductive portion exposed to the outside of the first housing acting as an antenna in a second state, in response to identifying the second state in which the second housing is slid out from the first housing, by the sensor.

According to various embodiments, since the size of the display region of the display can be switched by the housing having the slidable structure, and the antenna structure is switched based on the state of the housing, the electronic device can have a certain level of wireless communication performance regardless of the state of the housing.

According to various embodiments, in the slide-in state in which the size of the housing of the electronic device is reduced, the electronic device can smoothly perform low-band wireless communication by forming an antenna structure resonating at a frequency of a low band by coupling.

The effects that can be obtained from the present disclosure are not limited to those described above, and any other effects not mentioned herein will be clearly understood by those having ordinary knowledge in the art to which the present disclosure belongs, from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
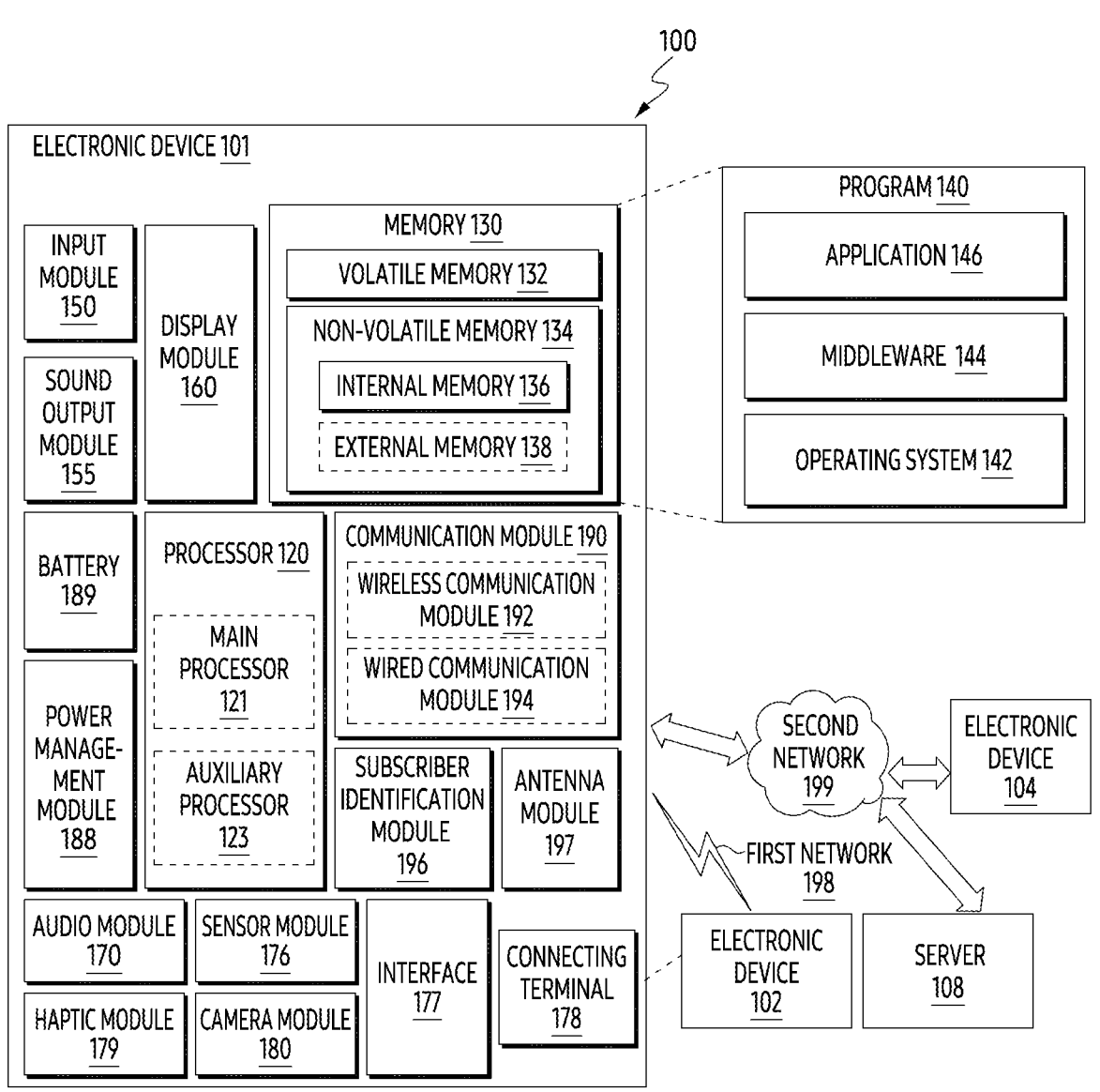
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module(SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation.

According to one embodiment, as at least portion of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as portion of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as portion of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as portion of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least portion of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as portion of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least portion of the function or the service. The one or more external electronic devices receiving the request may perform the at least portion of the function or the service requested, or an additional function or an additional service related to the request, and transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
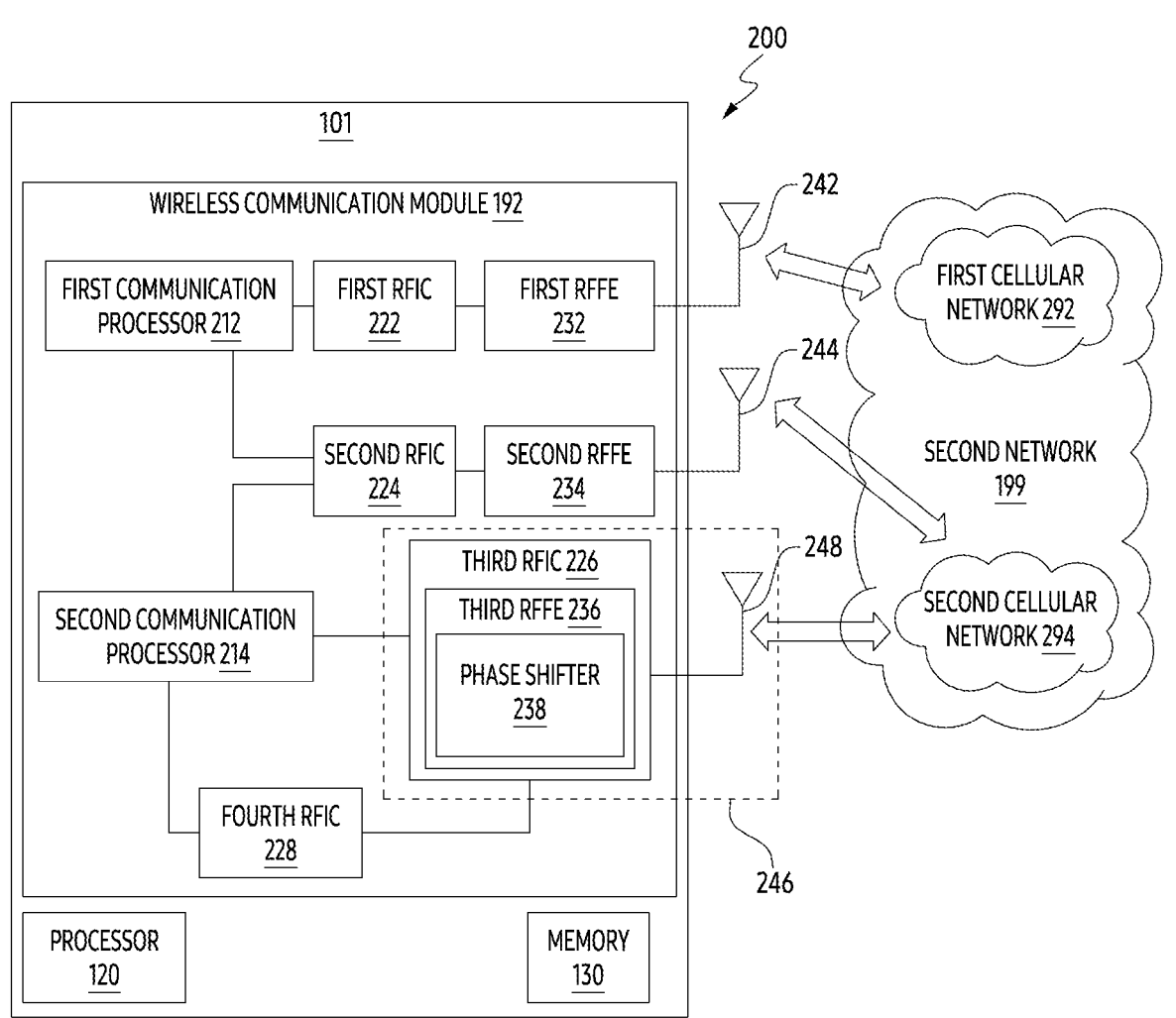
FIG. 2 is a block diagram of an example electronic device for supporting legacy network communication and 5G network communication according to various embodiments.

FIG. 2 is a block diagram 200 of the electronic device 101 for supporting legacy network communication and 5G network communication, according to various embodiments. Referring to FIG. 2, the electronic device 101 may include a first communication processor 212, a second communication processor 214, a first radio frequency integrated circuit (RFIC) 222, a second RFIC 224, and a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The second network 199 may include a first cellular network 292 and a second cellular network 294. According to another embodiment, the electronic device 101 may further include at least one of the components illustrated in FIG. 1, and the second network 199 may further include at least one other network. According to an embodiment, the first communication processor 212, the second communication processor 214, the first RFIC 222, the second RFIC 224, the fourth RFIC 228, the first RFFE 232, and the second RFFE 234 may constitute at least a portion of a wireless communication module 192. According to another embodiment, the fourth RFIC 228 may be omitted or may be included as a portion of the third RFIC 226.

The first communication processor 212 may support the establishment of a communication channel of a band to be used for wireless communication with the first cellular network 292 and legacy network communication through the established communication channel According to various embodiments, the first cellular network 292 may be a legacy network including a 2nd generation (2G), 3rd generation (3G), 4th generation (4G), and/or long-term evolution (LTE) network. The second communication processor 214 may support the establishment of a communication channel corresponding to a specified band (e.g., approximately 6 GHz to 60 GHz) among bands to be used for wireless communication with the second cellular network 294, and 5G network communication through the established communication channel According to various embodiments, the second cellular network 294 may be a 5G network defined by 3GPP. Additionally, according to an embodiment, the first communication processor 212 or the second communication processor 214 may support the establishment of a communication channel corresponding to another specified band (e.g., approximately 6 GHz or less) among bands to be used for wireless communication with the second cellular network 294, and 5G network communication through the established communication channel. According to an embodiment, the first communication processor 212 and the second communication processor 214 may be implemented in a single chip or a single package. According to various embodiments, the first communication processor 212 or the second communication processor 214 may be formed with the processor 120, the coprocessor 123 of FIG. 1, or the communication module 190 in a single chip or a single package.

Upon transmission, the first RFIC 222 may convert a baseband signal generated by the first communication processor 212 into a radio frequency (RF) signal of approximately 700 MHz to approximately 3 GHz used in the first cellular network 292 (e.g., a legacy network). Upon reception, an RF signal may be obtained from the first cellular network 292 (e.g., a legacy network) through an antenna (e.g., the first antenna module 242), and may be preprocessed through an RFFE (e.g., the first RFFE 232). The first RFIC 222 may convert the preprocessed RF signal into a baseband signal so as to be processed by the first communication processor 212.

Upon transmission, the second RFIC 224 may convert a baseband signal generated by the first communication processor 212 or the second communication processor 214 into an RF signal (hereinafter, referred to as a 5G Sub6 RF signal) of the Sub6 band (e.g., approximately 6 GHz or less) used in the second cellular network 294 (e.g., the 5G network). Upon reception, a 5G Sub6 RF signal may be obtained from the second cellular network 294 (e.g., the 5G network) through an antenna (e.g., the second antenna module 244), and may be preprocessed through an RFFE (e.g., the second RFFE 234). The second RFIC 224 may convert the preprocessed 5G Sub6 RF signal into a baseband signal so as to be processed by a corresponding one of the first communication processor 212 or the second communication processor 214.

The third RFIC 226 may convert a baseband signal generated by the second communication processor 214 into an RF signal (hereinafter, referred to as a 5G Above6 RF signal) of the 5G Above6 band (e.g., approximately 6 GHz to approximately 60 GHz) to be used in the second cellular network 294 (e.g., the 5G network). Upon reception, a 5G Above6 RF signal may be obtained from the second cellular network 294 (e.g., the 5G network) through an antenna (e.g., the antenna 248), and may be preprocessed through the third RFFE 236. For example, the third RFFE 236 may perform preprocessing of the signal by using a phase shifter 238. The third RFIC 226 may convert the preprocessed 5G Above6 RF signal into a baseband signal so as to be processed by the second communication processor 214. According to an embodiment, the third RFFE 236 may be formed as a portion of the third RFIC 226.

According to an embodiment, the electronic device 101 may include the fourth RFIC 228 separately from or at least as a portion of the third RFIC 226. In this case, the fourth RFIC 228 may convert the baseband signal generated by the second communication processor 214 into an RF signal (hereinafter, referred to as an intermediate frequency (IF) signal) of an intermediate frequency band (e.g., approximately 9 GHz to approximately 11 GHz), and then transmit the IF signal to the third RFIC 226. The third RFIC 226 may convert the IF signal into a 5G Above6 RF signal. Upon reception, a 5G Above6 RF signal may be received from the second cellular network 294 (e.g., the 5G network) through an antenna (e.g., the antenna 248), and may be converted into an IF signal by the third RFIC 226. The fourth RFIC 228 may convert the IF signal into the baseband signal so as to be processed by the second communication processor 214.

According to an embodiment, the first RFIC 222 and the second RFIC 224 may be implemented as a single chip or at least a portion of a single package. According to an embodiment, the first RFFE 232 and the second RFFE 234 may be implemented as a single chip or at least a portion of a single package. According to an embodiment, at least one of the first antenna module 242 or the second antenna module 244 may be omitted or combined with another antenna module to process RF signals of a plurality of corresponding bands.

According to an embodiment, the third RFIC 226 and the antenna 248 may be disposed on the same substrate to form a third antenna module 246. For example, the wireless communication module 192 or the processor 120 may be disposed on a first substrate (e.g., a main PCB). In this case, the third RFIC 226 may be disposed in a partial region (e.g., the lower surface) of a second substrate (e.g., a sub PCB) separate from the first substrate, and the antenna 248 may be disposed in another partial region (e.g., the upper surface) to form the third antenna module 246. According to an embodiment, the antenna 248 may include, for example, an antenna array that may be used for beamforming. By disposing the third RFIC 226 and the antenna 248 on the same substrate, it is possible to reduce the length of the transmission line therebetween. This, for example, may reduce the loss (e.g., attenuation) of a signal in a high frequency band (e.g., approximately 6 GHz to approximately 60 GHz) used for 5G network communication by the transmission line. Accordingly, the electronic device 101 may improve the quality or speed of communication with the second cellular network 294 (e.g., the 5G network).

The second cellular network 294 (e.g., the 5G network) may be operated independently of (e.g., Stand-Alone (SA)) or operated to be connected to (e.g., Non-Stand Alone (NSA)) the first cellular network 292 (e.g., the legacy network). For example, in the 5G network, there may be only an access network (e.g., 5G radio access network (RAN) or next-generation RAN (NG RAN)) and no core network (e.g., next-generation core (NGC)). In this case, after accessing the access network of the 5G network, the electronic device 101 may access an external network (e.g., the Internet) under the control of a core network (e.g., evolved packed core (EPC)) of the legacy network. Protocol information for communication with the legacy network (e.g., LTE protocol information) or protocol information for communication with the 5G network (e.g., New Radio (NR) protocol information) may be stored in the memory 230 and may be accessed by other components (e.g., the processor 120, the first communication processor 212, or the second communication processor 214).

Figure 3A:
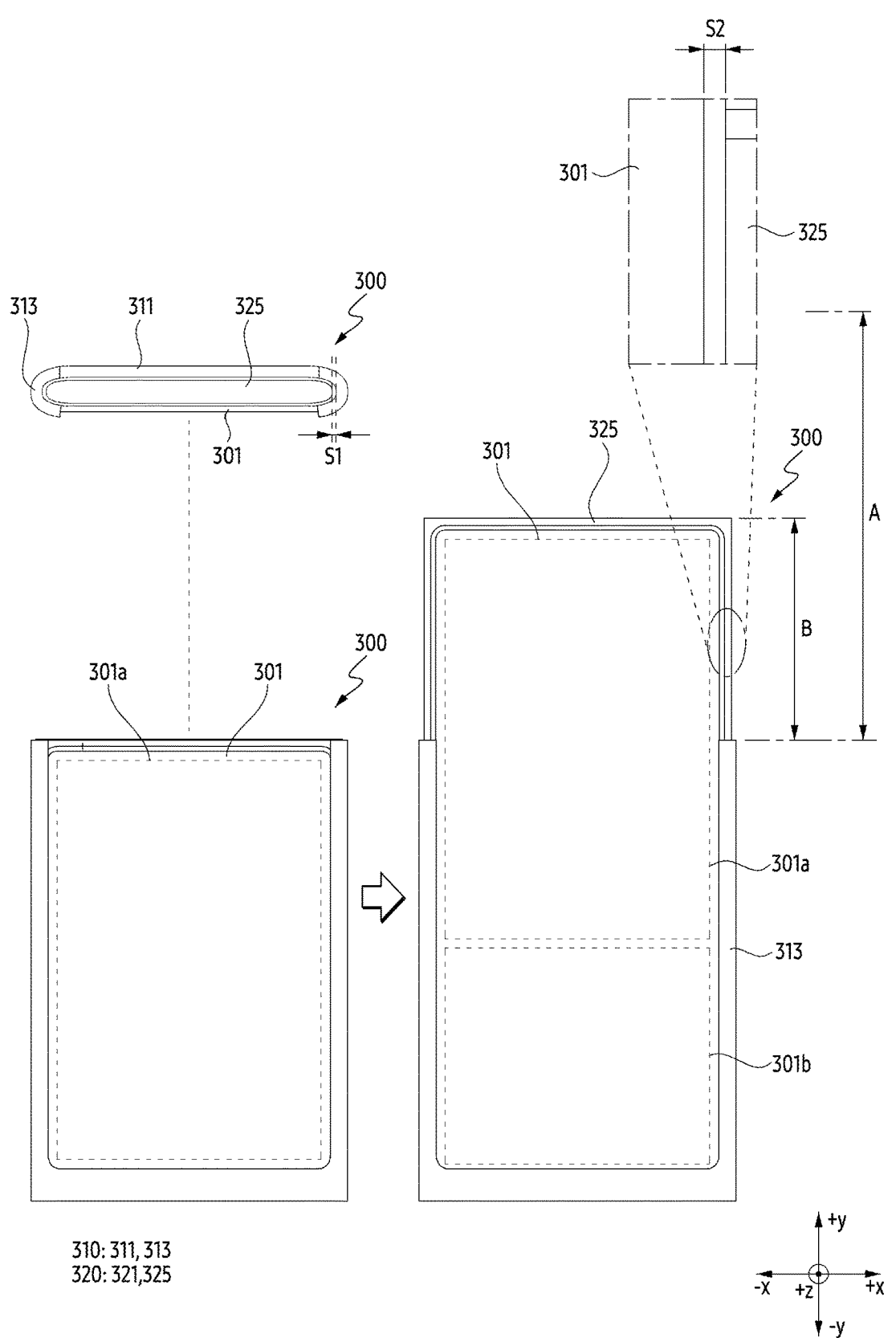
FIGS. 3A and 3B are diagrams illustrating switches in the structure and shape of an example electronic device including a flexible display, according to various embodiments.
Figure 3B:
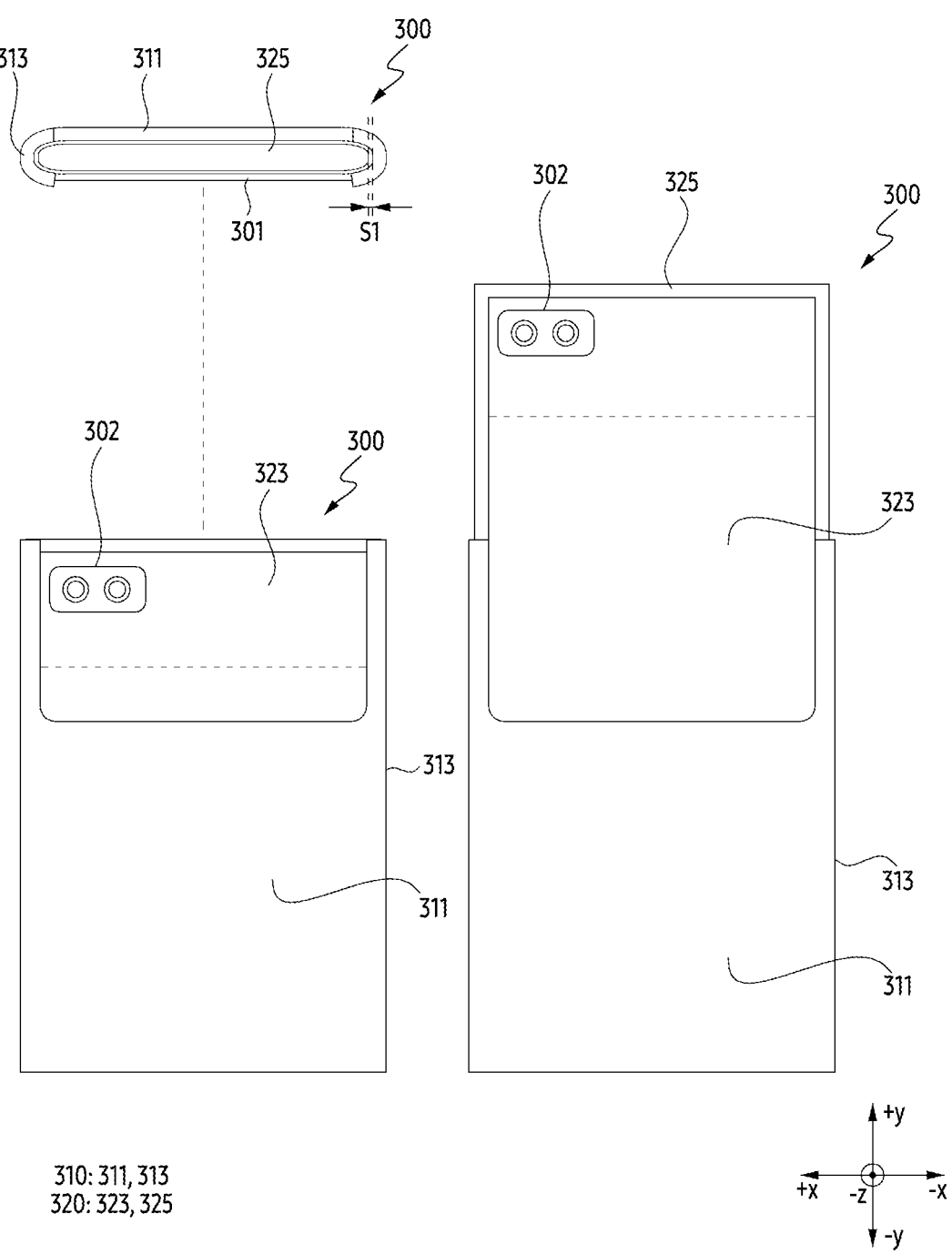

FIGS. 3A and 3B are diagrams illustrating switches in the structure and shape of an example electronic device including a flexible display, according to various embodiments.

FIG. 3A is a front view of the example electronic device 300 according to various embodiments, and FIG. 3B is a rear view of the example electronic device 300 according to various embodiments.

Referring to FIG. 3A, the electronic device 300 (e.g., the electronic device 101 of FIG. 1) according to an embodiment may include a first housing 310 and a second housing 320. According to an embodiment, the second housing 320 may move in a designated direction from the first housing 310, for example, in the first direction (+y direction or −y direction). For example, the second housing 320 may slide by the first distance A in the +y direction from the first housing 310. According to an embodiment, the second housing 320 may reciprocate within the first distance A in the first direction (+y direction or −y direction) from a portion of the first housing 310.

In various embodiments of the disclosure, a state in which a moving distance from the first housing 310 in the +y direction of the second housing 320 is a first distance A may be defined, for example, as a second state (e.g., an extended state or a slide-out state) of the electronic device 300. In various embodiments of the present document, the second state of the electronic device 300 may refer, for example, to a state in which the second portion 301b of the display 301 is visually identified outside the electronic device 300. For example, the second state of the electronic device 300 may refer, for example, to a state in which the entire second portion 301b of the display 301 is positioned outside the second housing 320.

According to an embodiment, the second housing 320 may move from the first housing 310 in the +y direction so that at least a portion of the second housing 320 may be slid out from the first housing 310. The second portion 301b of the display 301 may be slid out from the inside of the first housing 310 and/or the second housing 320 according to the movement of the second housing 320. The moving distance of the second housing 320 may be a moving distance (e.g., a second distance B) of the second housing slid out from the first housing 310. According to an embodiment, the second housing 320 may reciprocate within the first distance A. According to an embodiment, the moving distance (e.g., the second distance B) may have a size of about 0 to the first distance A.

In various embodiments of the disclosure, a state in which the moving distance from the first housing 310 of the second housing 320 in the +y direction is about 0 may be defined, for example, as a first state (e.g., a contraction state or a slide-in state) of the electronic device 300. In various embodiments of the disclosure, the first state of the electronic device 300 may refer, for example, to a state in which the second portion 301b of the display 301 is not visually identified from outside of the front surface of the electronic device 300. For example, the first state of the electronic device 300 may refer, for example, to a state in which the second portion 301b of the display 301 is positioned inside the first housing 310 and/or the second housing 320.

In an embodiment, the first state may be referred to, for example, as a first shape, and the second state may be referred to, for example, as a second shape. For example, the first shape may include a normal state, a reduced state, or a closed state, and the second shape may include an open state. In addition, in an embodiment, the electronic device 300 may form a third state (e.g., an intermediate state) that is a state between the first state and the second state. According to an embodiment, a state in which the moving distance of the second housing 320 from the first housing 310 in the +y direction is the second distance B between 0 and the first distance A may, for example, be defined as a third state of the electronic device 300. For example, the third state may be referred to as a third shape, and the third shape may include a free stop state.

In various embodiments of the disclosure, the electronic device 300, in an inter-transition to the second state and/or the first state, may be manually switched by a user's operation or may be automatically switched through a driving module (not illustrated) disposed inside the first housing 310 or the second housing 320. According to an embodiment, an operation of the driving module may be triggered based on a user input. According to an embodiment, a user input for triggering the operation of the driving module may include a touch input through display 301, a force touch input, and/or a gesture input. In an embodiment, the user input for triggering the operation of the driving module may include a voice input or an input of a physical button exposed to the outside of the first housing 310 or the second housing 320. According to an embodiment, the driving module may be driven in a semi-automatic manner in which an operation is triggered when a manual operation by an external force of a user is detected.

According to an embodiment, the electronic device 300 may be referred to, for example, as a "slidable electronic device" as the second housing 320 is designed to slide, or be referred to, for example, as a "rollable electronic device" as at least a portion of the display 301 is designed to be rolled inside the second housing 320 (or the first housing 310) based on the slide movement of the second housing 320.

According to an embodiment, the electronic device 300 may be coupled so that the second housing 320 is at least partially slidably movable from the first housing 310. According to an embodiment, at least a portion of the second housing 320 may be slid in the first housing 310. The second housing 320 may be coupled to the first housing 310 to be slid in the first housing 310 or to be slid out from the first housing 310.

Referring to FIG. 3B, the first housing 310 may include a first side member 313 disposed along the first cover plate 311 and a portion of the first cover plate 311. According to an embodiment, the first side member 313 may be coupled to or integrally formed with the portion of the first cover plate 311. Referring to FIG. 3B, the first side member 313 may be coupled to the portion of the first cover plate 311 except for a corner disposed in the +y direction among the corners of the first cover plate 311. At least a portion of the first side member 313 is not disposed at a position corresponding to a corner positioned in the +y direction of the first cover plate 311, thereby providing a structure in which the second housing 320 may slide.

According to an embodiment, the second housing 320 may include a second cover plate (e.g., the second cover plate 323 of FIG. 4B) and a second side member 325 surrounding the space between the display 301 and the second cover plate 323. The second side member 325 may be disposed along the circumference of the second cover plate 323. According to an embodiment, electronic components may be disposed in the space. The second cover plate 323 may protect electronic components disposed in the space. According to an embodiment, the first housing 310 and the second housing 320 may be spaced apart from each other in a second direction (+x direction or −x direction) perpendicular to the first direction. For example, the distance S1 between the first housing 310 and the second housing 320 may be about 0.1 mm to about 0.4 mm, but is not limited thereto.

According to an embodiment, when the electronic device 300 is viewed in the second direction, in the first state in which the second housing 320 is slid into the first housing 310, the first side member 313 and the second side member 325 may overlap more than in the second state. According to an embodiment, when the electronic device 300 is viewed in the second direction, in the second state in which the second housing 320 is slid out to the outside of the first housing 310, at least a portion of the second side member 325 may be positioned in the +y direction with respect to the first side member 313 and thus may be exposed to the outside of the first housing 310. According to an embodiment, the coupling form of the first housing 310 and the second housing 320 is not limited to the shape and coupling illustrated in FIGS. 3A and 3B, and may be implemented by a combination and/or coupling of other shapes or portions. For example, according to an embodiment, the electronic device 300 may be configured such that the second housing 320 may slide by a first distance A in the second direction from the first housing 310.

According to an embodiment, the display 301 may be disposed to be visually exposed from the outside through one direction (e.g., a +z direction) of each of the first housing

310 and the second housing 320. According to an embodiment, the electronic device 300 may include a supporting member (e.g., the supporting member 321 of FIG. 4C) positioned inside the second housing 320. For example, the display 301 may be disposed on the supporting member 321. According to an embodiment, the display 301 and the second side member 325 may be electrically spaced apart from each other. For example, the electrical separation distance S2 between the display 301 and the second side member 325 may be about 0.5 mm to about 0.9 mm, but is not limited thereto. According to an embodiment, the display region of the display 301 may include a first portion 301a and a second portion 301b.

According to an embodiment, the display region of the display 301 may be switched based on the slide movement of the second housing 320. According to an embodiment, the first portion 301a of the display 301 may be a display region that can be visually identified from the outside regardless of the state of the electronic device 300. According to an embodiment, the second portion 301b of the display 301 may be the display region extending from one end of the first portion 301a. According to an embodiment, a hole (not illustrated) into which the second portion 301b of the display 301 is slid out or slid in may be disposed adjacent to a side surface in the −y direction of the second side member 325 of the second housing 320. For example, the second portion 301b of the display 301 may be slid out from or slid into the boundary portion of the second housing 320 in the −y direction. In an embodiment, the position of the second portion 301b may be switched according to the sliding structure of the electronic device 300.

According to an embodiment, in the second state, the second portion 301b of the display 301 may be slid out from the inner space of the second housing 320 to be visually exposed to the outside. According to an embodiment, in the first state, the second portion 301b of the display 301 may be slid into the inner space of the second housing 320 and may not be exposed to the outside.

According to an embodiment, the second portion 301b of the display 301 may include a flexible display. The second portion 301b may be slid in a bent state while being rolled into the inner space of the first housing 310 and/or the second housing 320 in the first state.

According to an embodiment, the display region of the display 301 in the first state may be the first portion 301a of the display 301.

According to an embodiment, the display region of the display 301 in the second state may be a first portion 301a and a second portion 301b of the display 301.

According to an embodiment, the electronic device 300 may include a sensor module (not illustrated) and/or a camera module 302.

According to an embodiment, the sensor module may be disposed below the display 301 (e.g., in the −z direction from the display 301) and may detect an external environment based on information (e.g., light) received pass through the display 301. According to an embodiment, the sensor module may include at least one of a receiver, a proximity sensor, an ultrasonic sensor, a gesture sensor, a gyro sensor, an atmospheric pressure sensor, a magnetic sensor, an acceleration sensor, a grip sensor, a color sensor, an infrared sensor (IR) sensor, a biometric sensor, a temperature sensor, a humidity sensor, a motor encoder, or an indicator. According to an embodiment, at least a portion of the sensor module of the electronic device 300 may be visually exposed to the outside through a partial region of the display 301. According to an embodiment, the electronic device 300 may detect a moving distance (e.g., a second length B) using the sensor module. According to an embodiment, the electronic device 300 may generate moving distance information on the degree of moving distance sensed by the sensor. For example, the electronic device 300 may detect and/or check the degree of moving distance of the second housing 320 using moving distance information. According to an embodiment, the moving distance information may include information on the moving distance of the second housing 320.

According to an embodiment, at least a portion of the camera module 302 may be disposed in an inner space of the second housing 320. For example, the camera module 302 may be disposed on the supporting member inside the second housing 320 and be exposed to the outside through an opening formed in the second cover plate 323 of the second housing 320. The camera module 302 may include a plurality of cameras. For example, the camera module 302 may include at least one of a depth camera, a wide-angle camera, an ultra-wide-angle camera, or a telephoto camera.

According to an embodiment, the first housing 310 may be configured such that the camera module 302 may be exposed to the outside of the electronic device 300. For example, since the length extending in the first direction (+y direction or −y direction) of the first side member 313 is longer than the length extending in the first direction of the first cover plate 311, the first cover plate 311 of the first housing 310 may include a recessed region exposing the camera module 302 to the outside.

According to an embodiment, the display 301 may be supported by housings 310 and 320, and may be the display 301 in which an region of the display region is adjusted by interlocking with at least a portion of the housing 310 and 320 moving in the first direction. The display region may include a first portion 301a that is exposed to the outside regardless of at least a portion of the housings 310 and 320 moving in the first direction and a second portion 301b extending from one end of the first portion 301a and exposed to the outside by being slid out from the inner space of the housing 310 and 320 by interlocking with at least the portion of the housing 310 and 320 moving in the +y direction. The user of electronic device 300 may expand the visible display region of display 301 by sliding at least a portion of the second housing 320 to the outside of the first housing 310, when viewing the screen displayed on the display 301, for example, by switching to the second state (e.g., a slide-out state). When carrying the electronic device 300 without using, the user of the electronic device 300 may adjust the overall size of the electronic device 300 to a size that is easy to carry, by sliding the second housing 320 into the first housing 310 and changing to a first state (e.g., a slide-in state).

According to an embodiment, the electronic device 300 may include at least one antenna. The at least one antenna may receive a communication signal from the outside of the electronic device 300 or transmit a communication signal to the outside of the electronic device 300. According to an embodiment, the antenna may be switched based on whether the electronic device 300 is in the first state or the second state.

Figure 4A:
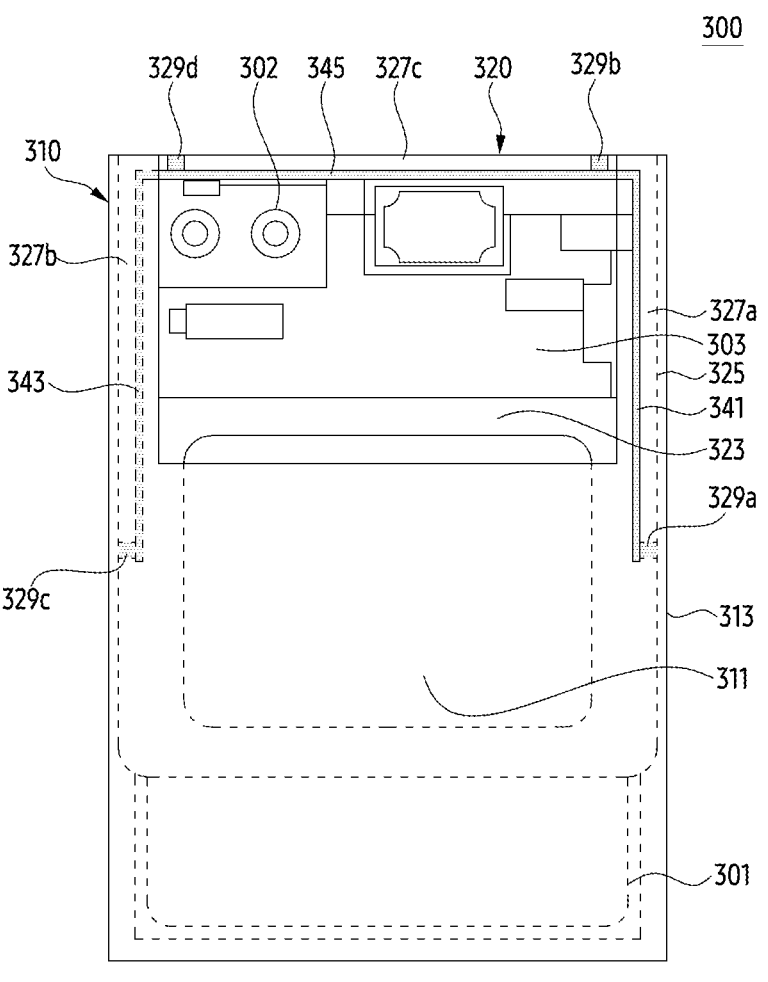
FIG. 4A is a rear view of a first state of an example electronic device according to various embodiments.
Figure 4A:
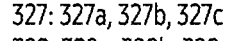
Figure 4B:
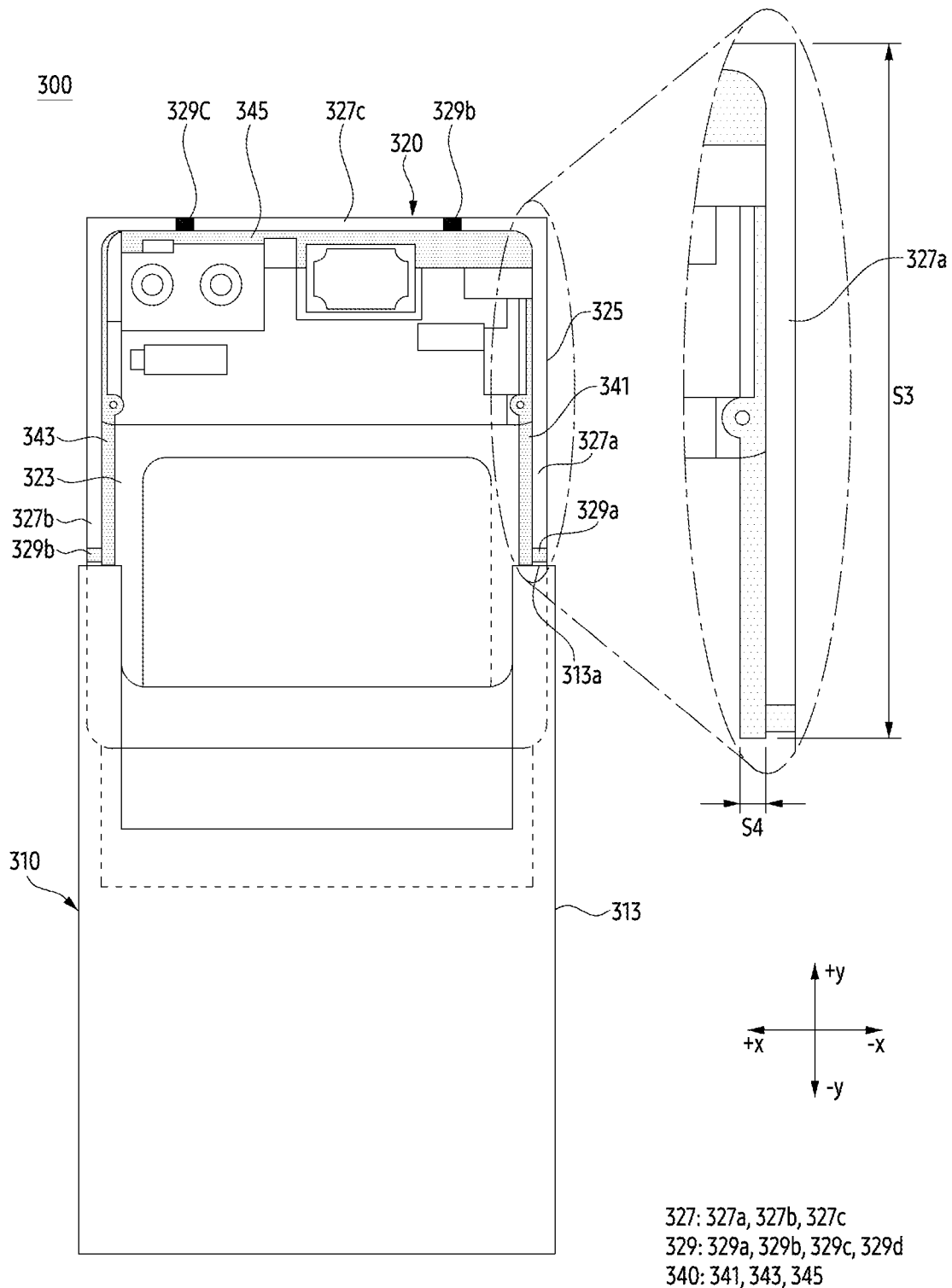
FIG. 4B is a rear view of a second state of an example electronic device according to various embodiments.

FIG. 4A is a rear view of a first state of an example electronic device according to various embodiments, FIG. 4B is a rear view of a second housing in a second state of an example electronic device according to various embodiments, and FIGS. 4C, 4D, 4E, and 4F illustrate examples of a second housing of an example electronic device according to various embodiments.

Referring to FIGS. 4A, 4B, 4C, 4D, 4E, and 4F, the second housing 320 may include a second cover plate 323 and a second side member 325 surrounding a space between the supporting member 321 and the second cover plate 323. According to an embodiment, the second side member 325 may be integrally formed with the supporting member 321 positioned inside the second housing 320. For another example, the second side member 325 may be integrally formed with the second cover plate 323.

According to an embodiment, various electronic components may be disposed in the space surrounded by the second side member 325. For example, a printed circuit board 303 for providing an electrical connection between a sensor (not illustrated), a camera module 302, and/or electronic components may be disposed in the space surrounded by the second side member 325. The second housing 320 may include the second cover plate 323 to protect the components.

According to an embodiment, the second side member 325 may overlap the first side member 313, and the size of the overlapping region of the first side member 313 and the second side member 325 may be changed by sliding movement of the second housing 320. Referring to FIG. 4A, in the first state, when the electronic device 300 is viewed in the second direction (+x direction or −x direction), the second side member 325 may at least partially overlap the first side member 313. Referring to FIG. 4B, since the first state is changed to the second state, the overlapping region of the first side member 313 and the second side member 325 may be reduced. According to an embodiment, in the first state, at least a portion of the second cover plate 323 may face the first cover plate 311.

According to an embodiment, the second side member 325 of the second housing 320 may include a plurality of conductive portions (e.g., metal) 327 and a plurality of non-conductive portions 329 disposed between the plurality of conductive portions 327. For example, the plurality of conductive portions 327 may form a segmentation structure spaced apart from each other by the plurality of non-conductive portions 329. For example, the plurality of conductive portions 327 and the plurality of non-conductive portions 329 may be integrally formed by double injection molding.

According to an embodiment, in the first state, the plurality of conductive portions 327 may include a first conductive portion 327a spaced apart from the first side member 313 in the second direction (+x direction or −x direction), a second conductive portion 327b facing the first conductive portion 327a, and/or a third conductive portion 327c disposed between the first conductive portion 327a and the second conductive portion 327b. According to an embodiment, the plurality of non-conductive portions 329 may include a first non-conductive portion 329a disposed at one end of the first conductive portion 327a, a second non-conductive portion 329b disposed at another end of the first conductive portion 327a, and a fourth non-conductive portion 329d disposed at the other end of the second conductive portion 327b. The fourth non-conductive portion 329d may be disposed between the third conductive portion 327c and the second conductive portion 327b. The second non-conductive portion 329b may be disposed between the third conductive portion 327c and the first conductive portion 327a.

Referring to FIGS. 4A, 4B, 4C, 4D, 4E, and 4F, the electronic device 300 may include at least one slit 340 disposed on the supporting member 321. For example, at least one slit 340 may include a first slit 341 adjacent to the first conductive portion 327a, a second slit 343 adjacent to the second conductive portion 327b, and a third slit 345 adjacent to the third conductive portion 327c. According to an embodiment, the second cover plate 323 may include a non-conductive portion 324 of the second cover plate 323 corresponding to the at least one slit 340 at a portion overlapping the at least one slit 340. For example, the second cover plate 323 may include an opening in a portion overlapping at least one slit 340, and the opening may be filled with an insulating material. For another example, when the second cover plate 323 is formed of a non-conductive material, the non-conductive portion 324 of the second cover plate 323 may be omitted.

According to an embodiment, the conductive portions 327 of the second side member 325 may be electrically separated from the supporting member 321 and the second cover plate 323 by at least one slit 340 and the non-conductive portion 324. For example, the first conductive portion 327a may be electrically separated from the supporting member 321 by the first slit 341, and the first conductive portion 327a may be electrically separated from the second cover plate 323 by the non-conductive portion 324. When the second side member 325 is fed power to the conductive portions 327 by being electrically separated from the supporting member 321 and the second cover plate 323, the conductive portions 327 may operate as antenna radiators.

According to an embodiment, the at least one slit 340 may include substantially the same material as the plurality of non-conductive portions 329 of the second side member 325 or may be extended from the plurality of non-conductive portions 329. For another example, the at least one slit 340 may be an opening region. For example, when the at least one slit 340 is an opening region, air may function as a non-conductive material that is a dielectric. For another example, when the at least one slit 340 is an opening region, the at least one slit 340 may be filled with a non-conductive material such as a polymer.

According to an embodiment, the first housing 310 may include a conductive material. For example, the first cover plate 311 and the first side member 313 of the first housing 310 may include a conductive material (e.g., metal). According to an embodiment, in the first state, the plurality of conductive portions 327 of the second side member 325 and the first housing 210 may operate as antennas for transmitting and/or receiving wireless signals by being electrically connected.

According to an embodiment, the second side member 325 may operate as an antenna for transmitting and receiving wireless signals of a designated band through a segmentation structure by the plurality of conductive portions 327 and the plurality of non-conductive portions 329. Referring to FIGS. 4A, 4B, 4C, 4D, 4E, and 4F, the second side surface member 325 may include a segmentation structure by the third conductive portion 327c, the third non-conductive portion 329c, and the fourth non-conductive portion 329d at a corner in the +y direction. The second side member may include the first conductive portion 327a at a corner in the −x direction and may include the second conductive portion 327b at a corner in the +x direction. According to an embodiment, each of the first to third conductive portions 327a, 327b, and 327c forming the segment structure may operate as an antenna radiator for transmitting and/or receiving a radio signal in a designated band by being fed power from a wireless communication module (e.g., the wireless communication module 192 of FIG. 1) of the electronic device 300.

Referring to FIG. 4B, the first conductive portion 327a may be exposed to the outside of the first side member 313 in the second state. According to an embodiment, the first conductive portion 327a may be positioned in the +y direction of the first side member 313 in the second state. According to an embodiment, in the second state, the first non-conductive portion 329a disposed at one end of the first conductive portion 327a may be disposed to be adjacent to the +y direction side surface 313a in of the first side member 313. For example, in the second state, a length S3 of the first conductive portion 327a in the first direction (+y direction or −y direction) from the first non-conductive portion 329a may be about 45 mm to about 50 mm. A width S4 of the first slit 341 may be about 1.5 mm to 2.0 mm.

According to an embodiment, the supporting member 321 and/or the second cover plate 323 may be integrally formed with the second side member 325. For example, the circumference of the supporting member 321 and/or the second cover plate 323 may be coupled to the second side member 325.

Figure 4C:
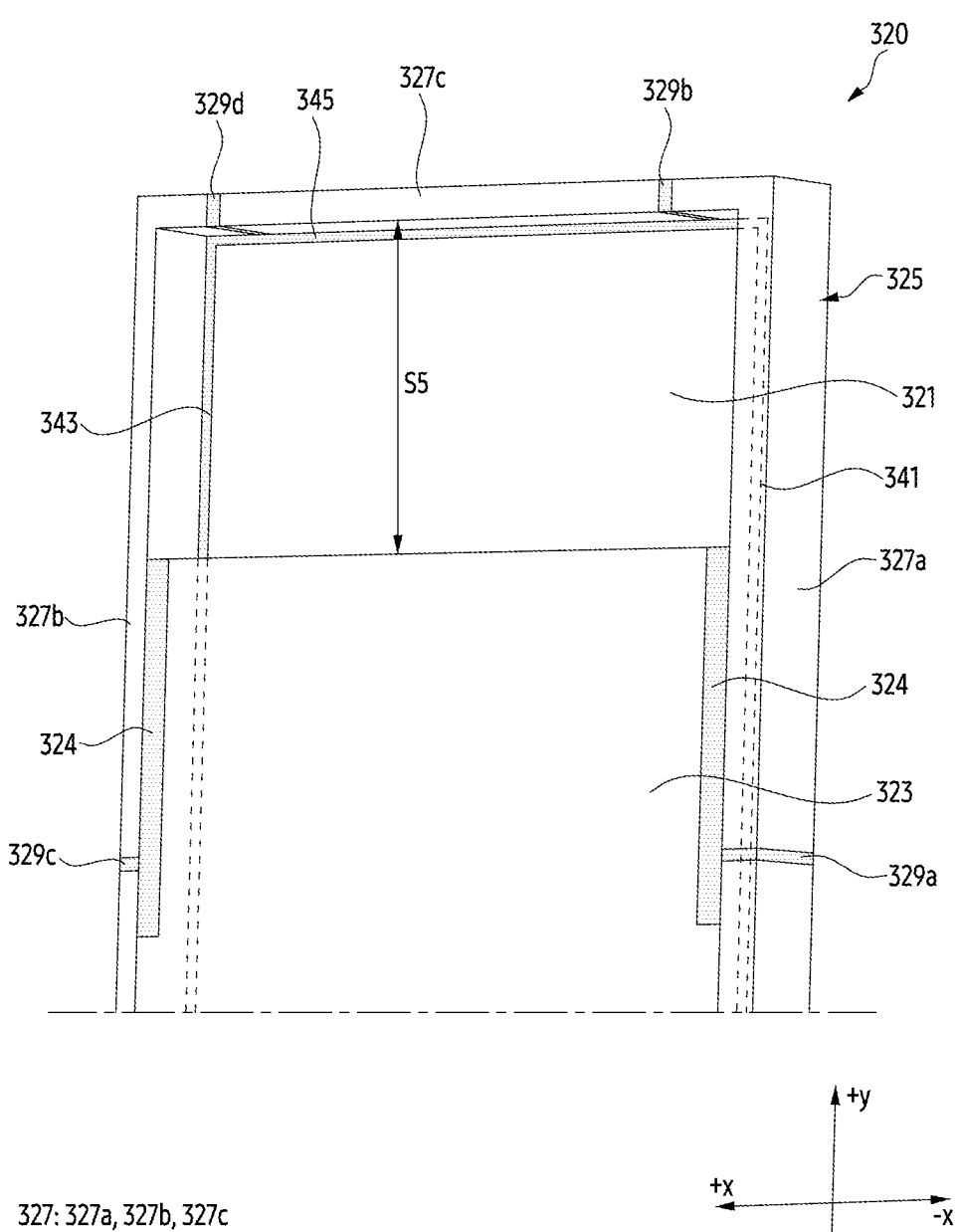
FIGS. 4C, 4D, 4E, and 4F illustrate examples of a second housing of an example electronic device according to various embodiments.

Referring to FIG. 4C, a gap between the second cover plate 323 and the third conductive portion 327c may be filled with a non-conductive material. For example, the second cover plate 323 may include a conductive material and may be filled with a non-conductive material by a distance S5 between the third conductive portion 327c and the portion including the conductive material of the second cover plate 323. For example, the second cover plate 323 and the non-conductive material may form one surface of the second housing 320 through the double injection molding.

FIG. 4C is a view in which a portion of one surface of the second housing 320 filled with the non-conductive material is omitted. For example, referring to FIG. 4C, a region between the second cover plate 323 and the third conductive portion 327c may include a non-conductive material (e.g., a polymer), and the second cover plate 323 may include a conductive material (e.g., a metal).

According to an embodiment, the distance S5 between the portion including the conductive material of the second cover plate 323 and the third conductive portion 327c may be variously designed. For another example, referring to FIG. 4E, the distance S5' between the portion including the conductive material of the second cover plate 323 and the third conductive portion 327c may be formed to be shorter than the distance S5 illustrated in FIG. 4C. Referring to FIG. 4E, the inner space of the second housing 320 may be covered by the second cover plate 323 including a conductive material.

Figure 4D:
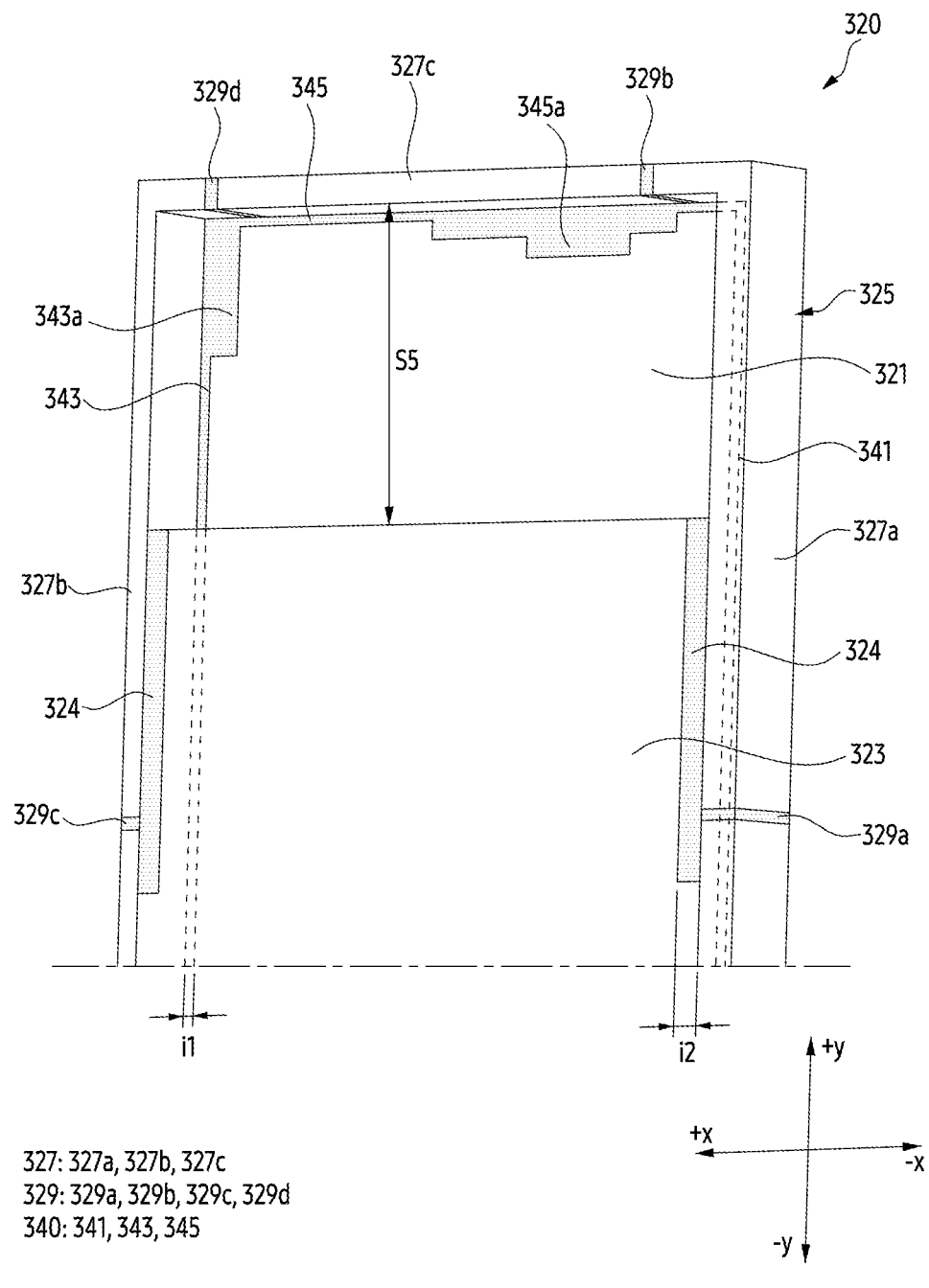
Figure 4E:
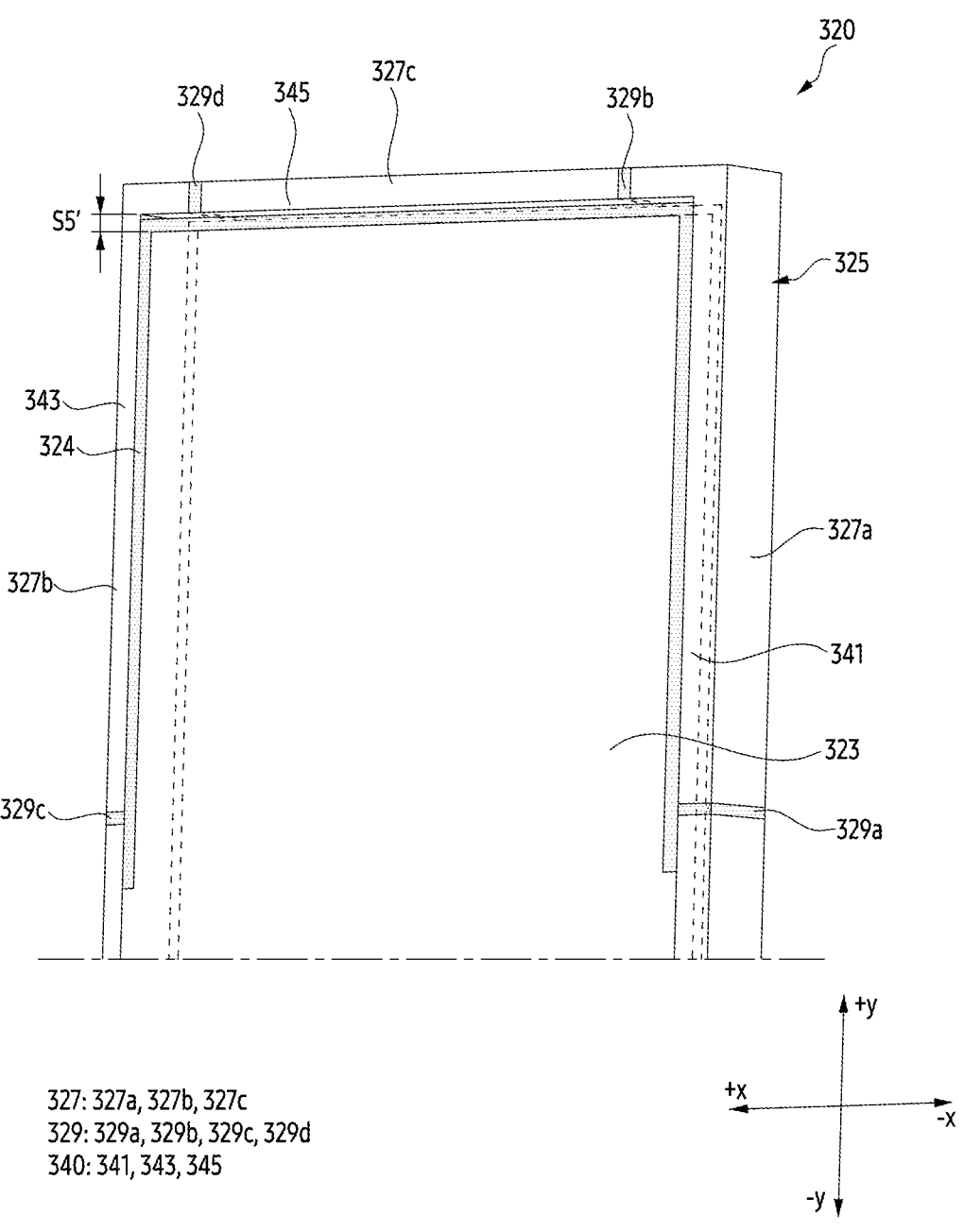
Figure 4F:
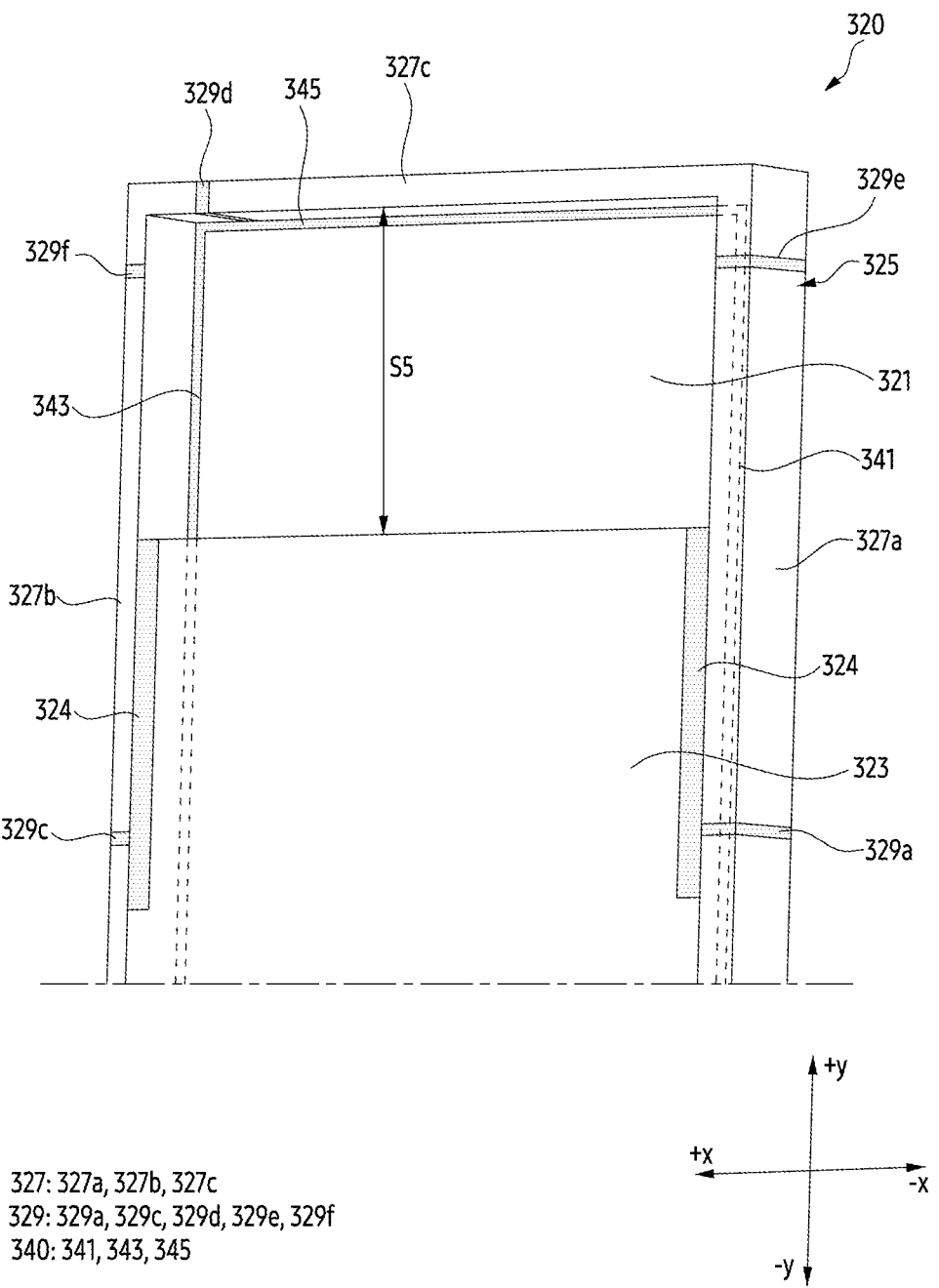

Referring to FIG. 4D, the at least one slit 340 may be formed in various shapes compared to the non-conductive portion 324 of the second cover plate 323. For example, the first slit 341, the second slit 343, and the third slit 345 may have different shapes. For example, the second slit 343 may include a region 343a having a thickness thicker than other portions, and the third slit 345 may include a stepped region 345a by having the thickness thicker than other portions. The shapes of the second slit 343 and the third slit 345 illustrated in FIG. 4D are illustrative and are not limited thereto.

According to an embodiment, when the electronic device (e.g., the electronic device 300 of FIG. 4B) is in the second state, the non-conductive portion 324 of the second cover plate 323 may be exposed to the outside. Since the non-conductive portion 324 that may be exposed to the outside is visually visible, it may be configured to have a designated shape or a designated interval. For example, the non-conductive portion 324 of the second cover plate 323 may have a shape extending thinly in the first direction (+y direction or −y direction), but is not limited thereto. According to an embodiment, the thickness i1 of the at least one slit 340 and the thickness i2 of the non-conductive portion 324 of the second cover plate 323 may be substantially the same or different. For example, the thickness i2 of the visually externally visible non-conductive portion 324 may be substantially equal to or thinner than the thickness i1 of the at least one slit 340.

According to an embodiment, when the second cover plate 323 and the second side member 325 are integrally formed, the at least one slit 340 may extend more in the −y direction than the position of the first non-conductive portion 329*a*.

According to an embodiment, the segmentation structure of the second housing 320 may be variously formed. For example, referring to FIG. 4F, in the plurality of non-conductive portions 329, the fifth non-conductive portion 329*e* disposed at an end portion of the first conductive portion 327*a* in the +y direction and the sixth non-conductive portion 329*f* disposed at an end portion of the second conductive portion 327*b* in the +y direction may be included and the second non-conductive portion (e.g., the second non-conductive portion 329*b* of FIG. 4C) may be omitted.

According to an embodiment, the position of the first non-conductive portion 329*a* may be determined depending on the moving distance of the second housing 320. For example, when the electronic device (e.g., the electronic device 300 of FIG. 4B) is in the second state, the first conductive portion 327*a* may not overlap the first side member (e.g., the first side member 313 of FIG. 4B). For another example, when the electronic device (e.g., the electronic device 300 of FIG. 4A) is in the first state, the first conductive portion 327*a* may overlap the first side member (e.g., the first side member 313 of FIG. 4A).

According to an embodiment, the conductive portion positioned in the −y direction from the first non-conductive portion 329*a* and the conductive portion positioned in the −y direction from the third non-conductive portion 329*c* may operate as an antenna for transmitting and/or receiving a signal of a frequency band distinguished from antennas formed by the first conductive portion 327*a* and the second conductive portion 327*b*. In addition, according to various arrangement structures of the plurality of non-conductive portions 329, the segmentation structure of the second side member 325 may be capable of various structures.

According to an embodiment, a distance from the first cover plate 311 (the first cover plate 311 of FIG. 4A) of the first housing (the first housing 310 of FIG. 4A) to the second cover plate 323 facing the first cover plate 311 may be about 0.3 mm to about 1.2 mm. Even when a distance from the first cover plate 311 of the first housing 310 to the second cover plate 323 facing the first cover plate 311 is designed to be a length of about 0.3 mm to about 1.2 mm, the plurality of conductive portions 327 may operate as antennas having substantially the same performance FIG. 5A is a view schematically illustrating a first state of an example electronic device according to various embodiments, and FIG. 5B is a view schematically illustrating a second state of an example electronic device according to various embodiments.

Figure 5A:
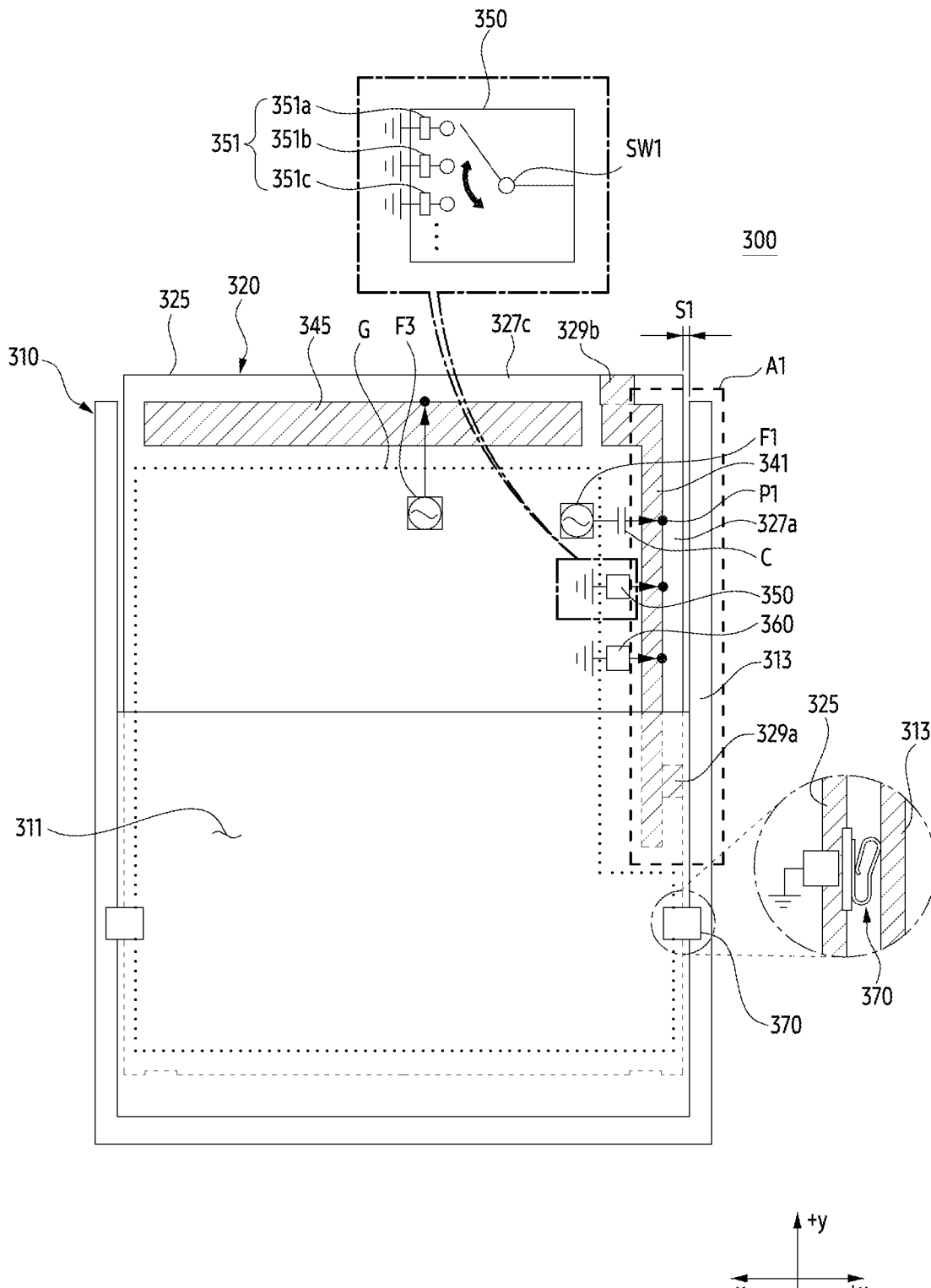
FIG. 5A is a view schematically illustrating a first state of an example electronic device according to various embodiments.
Figure 5B:
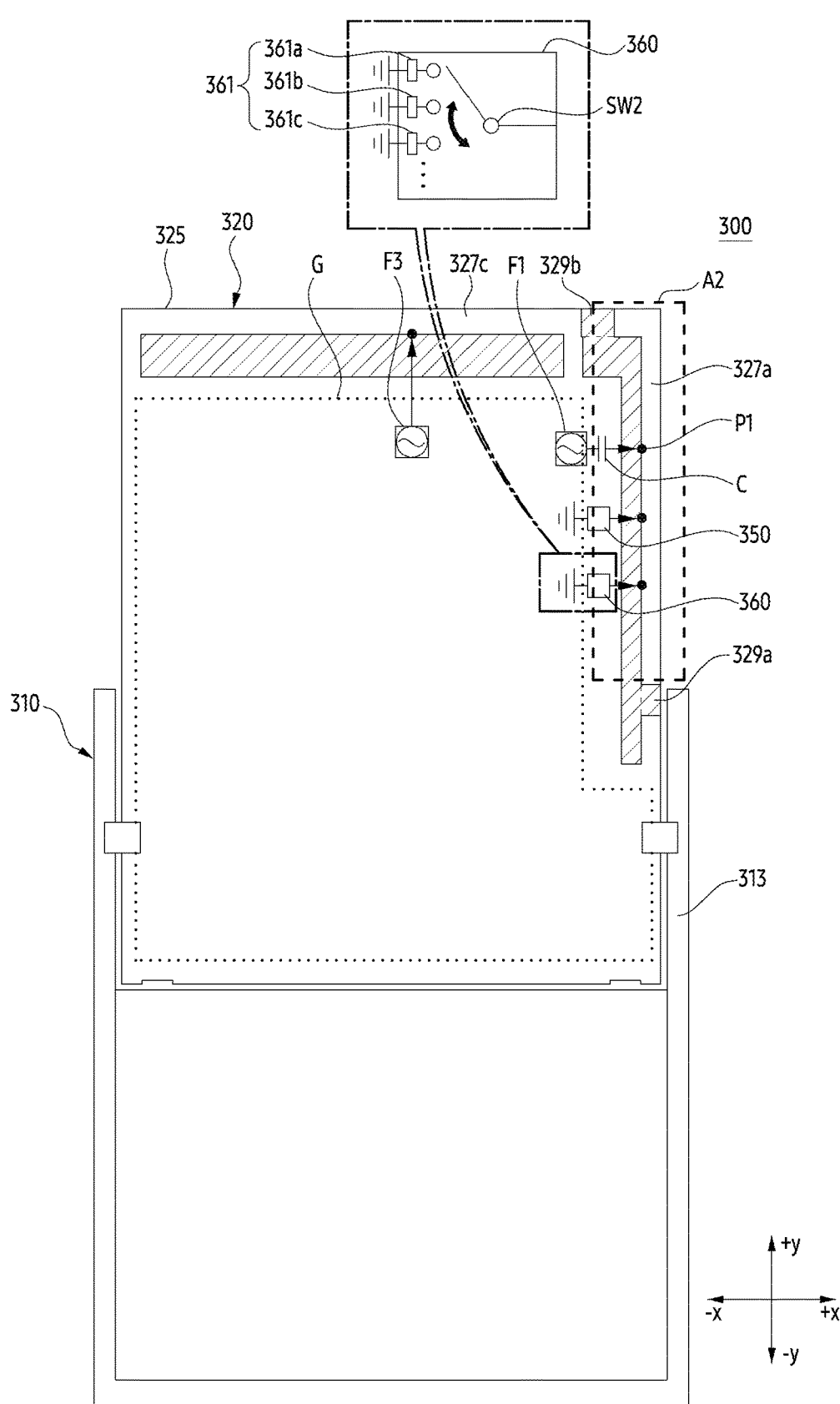
FIG. 5B is a view schematically illustrating a second state of an example electronic device according to various embodiments.

Referring to FIG. 5A, at least one conductive portion (e.g., the first conductive portion 327*a*) among the plurality of conductive portions 327 may include a feeding point (e.g., a first feeding point P1) that may be fed from the wireless communication module 192. For example, the first feeding point P1 may be electromagnetically connected to the first feeding portion F1. According to an embodiment, the radio signal provided from the first feeding portion F1 may be fed (e.g., coupling feeding) to the first feeding point P1 through the capacitor C positioned between the first feeding portion F1 and the first conductive portion 327*a*. For example, the frequency of the radio signal provided from the first feeding portion F1 may be adjusted through the matching circuit (e.g., the feeding matching portion 394 of FIG. 6) including the capacitor C. According to an embodiment, when being fed through the capacitor C to the first feeding point P1 in the first state, the first conductive portion 327*a* and the first side member 313 may be electromagnetically connected by the coupling. According to an embodiment, when the first conductive portion 327*a* and the first side member 313 are coupled in the first state, the first housing 310 and the first conductive portion 327*a* may be operated as an antenna A1 in a first state.

According to an embodiment, in the first state, the processor (e.g., the processor 120 of FIG. 1) may be configured to communicate with an external electronic device through the antenna A1 in a first state including at least a portion of the first conductive portion 327*a* and the first housing 310. In the first state of the electronic device 300, the antenna A1 in the first state may refer, for example, to an antenna operated by coupling at least one of a plurality of conductive portions 327 of the second side member 325 with the first side member 313. According to an embodiment, the first side member 313 may be coupled by being electromagnetically connected to the adjacent first conductive portion 327*a*. At least a portion of the first housing 310 may be operated as an antenna radiator by being induced by the side region radiation current of the first housing 310 by the first side member 313 coupled to the first conductive portion 327*a*. Based on the electromagnetic connection, the antenna A1 in the first state may include the first conductive portion 327*a* and at least a portion of the first housing 310 electromagnetically connected to the first conductive portion 327*a*.

According to an embodiment, an impedance matching circuit (e.g., a first impedance matching circuit 350) for adjusting the resonant frequency of the antenna A1 in the first state may be disposed between the ground region G in the second housing 320 and the first conductive portion 327*a*. For example, the first impedance matching circuit 350 may include an aperture tuner including various passive components. The ground region G illustrated in FIG. 5A may refer, for example, to a ground plane of the supporting member 321, a ground plane of the second cover plate 323, and/or a ground layer of the printed circuit board (303 of FIG. 4A).

According to an embodiment, the first impedance matching circuit 350 may include a first impedance device 351, and a first switch SW1 capable of electrically connecting the first impedance device 351 to the first conductive portion 327*a*. According to an embodiment, the first impedance device 351 may include at least one capacitor having a designated capacitance value or at least one inductor. For example, the first impedance device 351 may include a first capacitor 351*a* having a first capacitance value, a second capacitor 351*b* having a second capacitance value, and/or a third capacitor 351*c* having a third capacitance value, but is not limited thereto. According to an embodiment, the processor 120 may electrically connect the first conductive portion 327*a* to one of the plurality of first impedance devices 351 by controlling the first switch SW1. The resonant frequency of the antenna A1 in the first state may be set by the value of one first impedance device 351 connected to the first switch SW1.

According to an embodiment, the antenna A1 in the first state may operate as a coupled inverted-F antenna having a structure in which the first conductive portion 327a and the first side member 313 are coupled. According to an embodiment, the distance S1 between the first conductive portion 327a and the first side member 313 may be designed such that the antenna A1 in the first state has resonant characteristics in a designated frequency band. For example, the distance S1 may be about 0.1 mm to about 0.4 mm, but is not limited thereto. According to an embodiment, in the first state, the electronic device 300 may communicate with the external electronic device through the first conductive portion 327a, and the first antenna A1 formed by the first conductive portion 327a and the first housing 310.

According to an embodiment, the electronic device 300 may further include a separate antenna distinguished from the antenna A1 in the first state. For example, the third slit 345 may operate as a slot antenna by being fed to the third slit 345 by the third feeding portion F3.

According to an embodiment, a connecting member 370 may be disposed between the first housing 310 and the second housing 320 to electrically short the first housing 310 and the second side member 325. According to an embodiment, the connecting member 370 may include a C-clip, a bearing, or a conductive foam to electrically connect the first side member 313 and the second housing 320 even when the second housing 320 slides. For example, the connecting member 370 may be positioned in the second housing 320 and maintain a contact point along the inner surface of the first side member 313 during the movement of the second housing 320. The connecting member 370 may electrically connect the first housing 310 to the ground region G to provide a path of an electrical signal applied from the first feeding portion F1 to the antenna A1 in a first state. According to an embodiment, the connecting member 370 may reduce the generation of parasitic resonance in the radiation frequency band of the antenna A1 in the first state by shorting the first housing 310 and the second side member 325.

According to an embodiment, the connecting member 370 may be disposed at a designated position so that the resonant frequency of the antenna A1 in the first state may be formed in a designated frequency band. According to an embodiment, the connecting member 370 may be positioned in the −y direction from the first non-conductive portion 329a. According to an embodiment, the resonant frequency band of the antenna A1 in the first state formed by the coupling of the first conductive portion 327a and the first side member 313 may be set based on the position of the connecting member 370. For example, since the connecting member 370 is disposed relatively close to the first feeding portion F1, when the path of the electrical signal formed by the point where the connecting member 370 and the second side member 325 contact each other is short, the resonant frequency of the antenna A1 in the first state may be set in a relatively high frequency band. For another example, since the connecting member 370 is disposed relatively far from the first feeding portion F1, when the path of the electrical signal formed by the point where the connecting member 370 and the second side member 325 contact each other is long, the resonant frequency of the antenna A1 in the first state may be set in a relatively low frequency band. The electronic device 300 according to an embodiment may include a tuning element or a switching element that connects the first housing 310, the connecting member 370, and/or the second housing 320. The tuning element or the switching element may selectively connect one point of the first housing 310 and one point of the second housing 320 and may be used as a matching circuit. The electrical length may be adjusted by adjusting contact point positions of the conductive portions 327 and the first side member 313 of the second side member 325 using the tuning element and/or the switching element.

Referring to FIG. 5B, in the second state, an antenna A2 in a second state including a first conductive portion 327a that is electromagnetically disconnected from the first side member 313 may be formed. The antenna A2 in the second state may refer, for example, to an antenna formed by at least one of the plurality of conductive portions 327 of the second side member 325 in the second state of the electronic device 300. For example, in the second state, since a portion that does not overlap the first conductive portion 327a and the first side member 313 of the first housing 310 exists, the antenna A2 in the second state may be formed by the first conductive portion 327a. The antenna A2 in the second state may refer to an inverted F antenna (IFA) that is fed through the capacitor C to the first feeding point P1. According to an embodiment, in the second state, the electronic device 300 may communicate with an external electronic device through the antenna A2 in the second state in which the first conductive portion 327a is used as a radiator.

According to an embodiment, the impedance matching circuit (e.g., the second impedance matching circuit 360) may include a second impedance element 361 and a second switch SW2 capable of electrically connecting the second impedance device 361 and the first conductive portion 327a. According to an embodiment, the second impedance device 361 may include at least one inductor with a designated inductance value or at least one capacitor. For example, the second impedance element 361 may include a first inductor 361a having a first inductance value, a second inductor 361b having a second inductance value, and/or a third inductor 361c having a third inductance value, but is not limited thereto. According to an embodiment, the processor 120 may electrically connect one of the first conductive portion 327a and the second impedance element 361 by controlling the second switch SW2. The resonant frequency of the antenna A2 in the second state may be set by the value of the second impedance element 361 connected to the second switch SW2.

According to an embodiment, depending on the state of the electronic device, at least a portion of the first side member 313 and a first conductive portion 327a coupled to each other, or the first conductive portion 327a may be used as an antenna radiator. According to an embodiment, in response to identifying the first state, the processor 120 may be configured to communicate with an external electronic device through the antenna A1 in a first state (e.g., the antenna in a state in which the first side member 313 and the first conductive portion 327a are coupled). In the first state, at least a portion of the first housing 310 may operate as an antenna by electromagnetically connecting the first side member 313 and the first conductive portion 327a. According to an embodiment, the antenna A1 in the first state may be configured to use the first conductive portion 327a and the first housing 310 electromagnetically connected to the first conductive portion 327a as an antenna radiator.

According to an embodiment, in response to identifying the second state, the processor 120 may be configured to communicate with an external electronic device through the antenna A2 in the second state (e.g., an antenna in a state in which the first conductive portion 327a operates alone). The antenna A2 in the second state may be configured to use the first conductive portion 327a exposed to the outside of the first housing 310 as an antenna radiator.

According to an embodiment, the electronic device 300 may expand and reduce the display region of the display (e.g., the display 301 of FIG. 3) through a state change due to sliding movement of the second housing 320. According to an embodiment, the electronic device may constantly secure communication performance by switching the antenna structures A1 and A2 based on the state of the electronic device 300. For example, in the first state, since the first conductive portion 327a and at least a portion of the first housing 310 electromagnetically connected to the first conductive portion 327a are used as an antenna radiator, the electronic device 300 may reduce radiation performance degradation of the antenna at a frequency (e.g., about 700 MHz band) in a designated band caused by overlapping the first conductive portion 327a and the first side member 313, and secure a resonant frequency of the antenna A1 in the first state in a designated frequency band.

Figure 6:
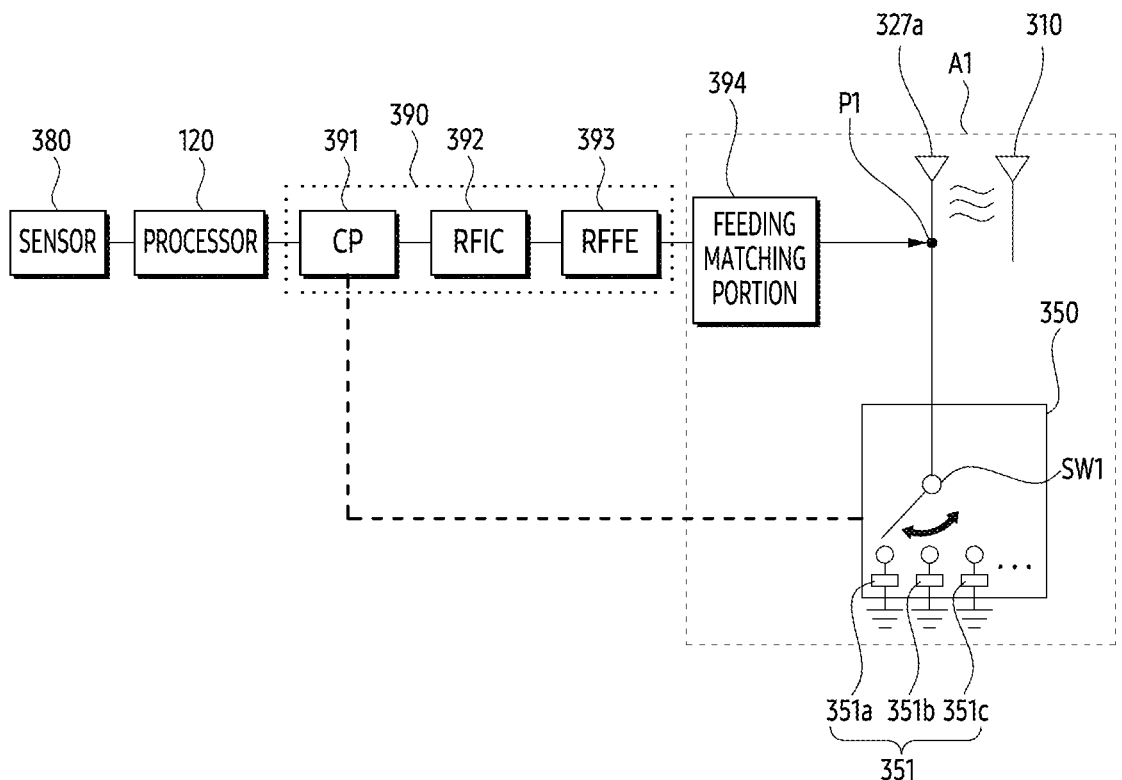
FIG. 6 is a block diagram of a wireless communication module in a first state of an example electronic device according to various embodiments.

FIG. 6 is a block diagram of a wireless communication module in a first state of an example electronic device according to various embodiments.

Referring to FIG. 6, according to an embodiment, the electronic device (e.g., the electronic device 300 of FIG. 4C) may include a sensor 380 that outputs a signal related to the state of the electronic device 300, a processor 120 operatively connected to the sensor 380, and a wireless communication module 390. According to an embodiment, the wireless communication module 390 may include a communication processor 391, a radio frequency integrated circuit (RFIC) 392, and a radio frequency front end (RFEE) 393. According to an embodiment, the electronic device 300 may transmit and/or receive a radio signal using the wireless communication module 390 and the antenna A1 in the first state.

According to an embodiment, the sensor 380 may output a signal related to the state of the electronic device 300. The sensor 380 may sense a first state of the electronic device 300 or a second state. For example, the sensor 380 may include at least one of a proximity sensor, an illuminance sensor, a magnetic sensor, a hall sensor, a bending sensor, and an infrared sensor, or a combination thereof. For example, the sensor 380 may be a hall sensor disposed between the first housing (e.g., the first housing 310 of FIG. 4C) and the second housing (e.g., the second housing 320 of FIG. 4C) and the second housing 320 may include a magnetic material that causes a Hall-effect. The sensor 380 may output a signal regarding the state of the electronic device 300 when detecting movement of the magnetic material by sliding of the second housing 320. The processor 120 may identify the state of the electronic device 300 based on the signal output from the sensor 380.

According to an embodiment, the communication processor 391 may control another hardware component included in the wireless communication module 390 to transmit and/or receive a radio signal between the electronic device 300 and an external electronic device that is distinguished from each other. For example, in response to receiving a request from the processor 120 to transmit data to the external electronic device, the communication processor 391 may output an electrical signal (e.g., a digital data signal) having a frequency band of a base-band based on the data to the RFIC 392.

According to an embodiment, the RFIC 392 may upward convert (up-convert) the base-band signal generated by the communication processor 391 into a signal of a designated frequency band. On receiving, the radio signal may be obtained through the antenna A1 in the first state and preprocessed through the RFFE 393. RFIC 392 may downward convert (down-convert) the preprocessed wireless signal into a baseband signal for processing by the communication processor 391.

According to an embodiment, in the first state, the electronic device 300 may transmit and/or receive a radio signal through the antenna A1 in a first state formed by the first conductive portion (e.g., the first conductive portion 327a in FIG. 4C) and the first housing 310 coupled to each other.

According to an embodiment, in the first state, the electronic device 300 may transmit a radio signal through the antenna A1 in the first state. When the processor 120 requests data transmission to the communication processor 391, the communication processor 391 may transmit an electrical signal having a frequency of a base band based on the data to the RFIC 392. The RFIC 392 may upward convert (up-convert) the frequency of the electrical signal from the frequency of the baseband to the frequency of the radio frequency band (e.g., low band (e.g., about 700 MHz to about 960 MHz). In the antenna A1 in the first state, a radio signal corresponding to the electrical signal increased by the frequency of the radio frequency band may be transmitted. For example, a signal path from the processor 120 to the communication processor 391, the RFIC 392, the RFFE 393, and the antenna A1 in the first state may be used for transmission of a radio signal by the electronic device 300.

According to an embodiment, when feeding from the wireless communication module 192 to the first feeding point P1, the feeding matching portion 394 may adjust the resonant frequency of the antenna A1 in the first state. For example, the feeding matching portion 394 may include a variable capacitor (e.g., the capacitor C of FIG. 4C). The processor 120 and/or the communication processor 391 may adjust the resonant frequency of the antenna A1 in the first state by adjusting the capacitance of the variable capacitor.

According to an embodiment, in the first state, since the second side member (e.g., the second side member 325 of FIG. 4C) is covered by the first side member (e.g., the first side member 313 of FIG. 4C), the plurality of conductive portions (e.g., the plurality of conductive portions 327 of FIG. 4B) may be difficult to be directly used as an antenna radiator. According to an embodiment, in order to form the antenna A1 in the first state, the at least one conductive portion (e.g., the first conductive portion 327a) of the plurality of conductive portions 327 of the second side member 325 and the first housing 310 may be electromagnetically connected (e.g., coupled connection). For example, in order to form the antenna A1 in the first state, the first conductive portion 327a and the first side member 313 may be coupled to each other. According to an embodiment, in the first state, the electronic device 300 may communicate with an external electronic device based on a resonant frequency set to the first frequency through the antenna A1 in the first state. For example, the first frequency may be a frequency of a low band (e.g., about 700 MHz to about 960 MHz).

According to an embodiment, the electronic device 300 may include a first impedance matching circuit 350 electrically connected to the first conductive portion 327a. According to an embodiment, in response to identifying the first state of the electronic device 300 by the sensor 380, the processor 120 may control the first impedance matching circuit 350 to adjust the resonant frequency of the antenna A1 in the first state to a resonant frequency set as the first frequency.

According to an embodiment, the first impedance matching circuit 350 may include a first impedance device 351 having a designated impedance value and a first switch SW1 capable of electrically connecting the first impedance device 351 to the first conductive portion 327a. For example, the first impedance device 351 may include a first capacitor 351a having a 1.0 pF value, a second capacitor 351b having a 3.3 pF value, and/or a third capacitor 351c having a 5.6 pF value, but is not limited thereto, and may include an inductor instead of a capacitor. The first impedance device 351 may be grounded to a ground region (e.g., the ground region G of FIG. 4C) in the second housing 320, thereby electrically connecting the ground region G to the first conductive portion 327a.

According to an embodiment, in response to identifying the first state by the sensor 380, the electronic device 300 may control the resonant frequency of the antenna A1 in the first state to a resonant frequency set as the first frequency by controlling the first impedance matching circuit 350. In an embodiment, the processor 120 may electrically connect the first switch SW1 and the first impedance element 351. By the connection, the first conductive portion 327a and the first impedance device 351 may be electrically connected to each other. The processor 120 may electrically connect the first impedance element 351 and the first conductive portion 327a to set the resonant frequency of the antenna A1 in the first state to a resonant frequency set as the first frequency.

In FIG. 6, the first impedance matching circuit 350 is illustrated to include a plurality of capacitors 351a, 351b and 351c having unique capacitance values, but at least portion of the plurality of capacitors 351a, 351b, and 351c may be replaced with a variable capacitor. For example, the first impedance element 351 may be or include a variable capacitor capable of adjusting a capacitance value. In the first state, the processor 120 may control the resonant frequency of the antenna A1 in the first state to the resonant frequency set as the first frequency by adjusting the capacitance value of the variable capacitor.

According to an embodiment, the electronic device 300 may adjust the resonant frequency of the antenna A1 in the first state to receive a radio signal in the low band according to the state of the electronic device 300. In the first state, since the second housing 320 is accommodated in the first housing 310, the performance of the antenna for the low band may be weakened when the plurality of conductive portions 327 of the second side member 325 are used as an antenna. According to an embodiment, in the first state, the electronic device 300 may form an antenna for a low band by using the antenna A1 in the first state formed by the first conductive portion 327a and the first housing 310. According to an embodiment, in the first state, the electronic device 300 may improve the performance of the antenna A1 in the first state by controlling the resonant frequency of the antenna A1 in the first state to a resonant frequency set to the first frequency for smoothly transmitting and/or receiving the radio signal in the low band.

Figure 7:
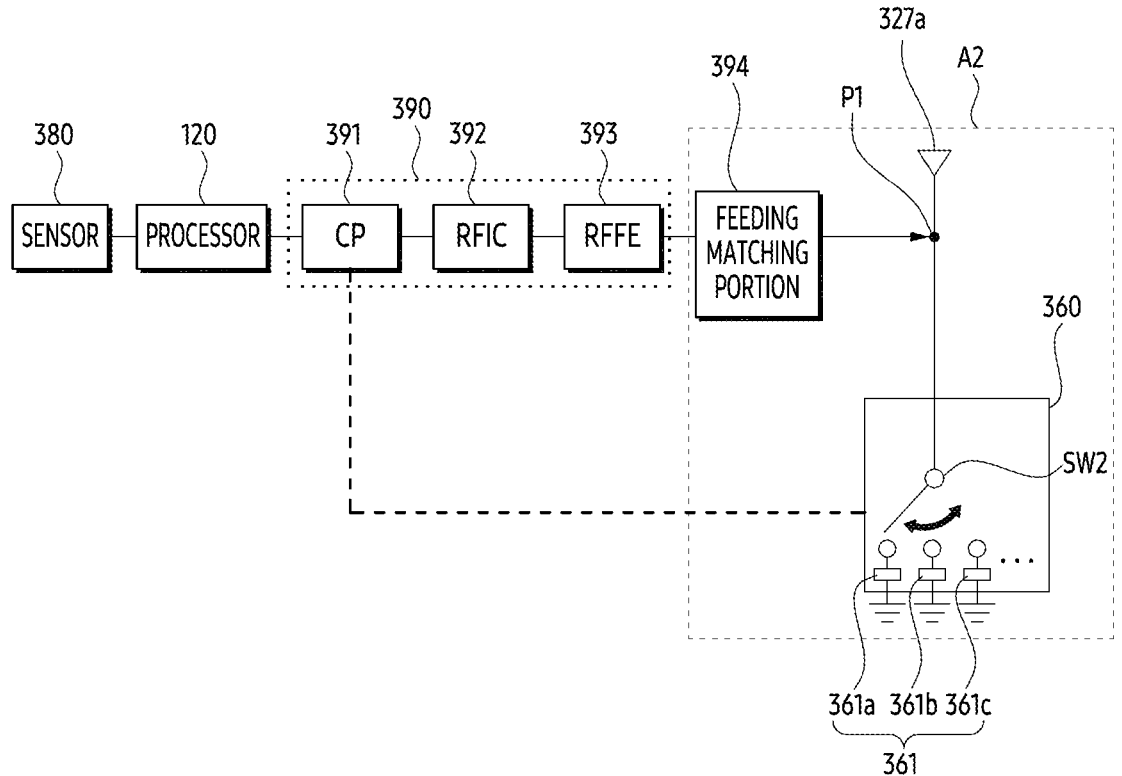
FIG. 7 is a block diagram of a wireless communication module in a second state of an example electronic device according to various embodiments.

FIG. 7 is a block diagram of a wireless communication module in a second state of an example electronic device according to various embodiments. Hereinafter, a description overlapping with the description of FIG. 6 will not be repeated.

According to an embodiment, in the second state, the first conductive portion (e.g., the first conductive portion 327a of FIG. 5B) may form the antenna A2 in a second state for a low band. According to an embodiment, in the second state, the electronic device (e.g., the electronic device 300 of FIG. 5B) may communicate with the external electronic device based on the resonant frequency set to the second frequency through the antenna A2 in the second state.

According to an embodiment, when the feeding matching portion 394 is fed from the wireless communication module 192 to the first feeding point P1, the resonant frequency of the antenna A2 in the second state may be adjusted. For example, the feeding matching portion 394 may include a variable capacitor (e.g., the capacitor C of FIG. 5B). The processor 120 and/or the communication processor 391 may adjust the resonant frequency of the antenna A2 in the second state by adjusting the capacitance of the variable capacitor.

According to an embodiment, the electronic device 300 may include a second impedance matching circuit 360 electrically connected to the first conductive portion 327a. According to an embodiment, in response to identifying the second state of the electronic device 300 by the sensor 380, the processor 120 may adjust the resonant frequency of the antenna A2 in the second state to a resonant frequency set as the second frequency by controlling the second impedance matching circuit 360.

According to an embodiment, the second impedance matching circuit 360 may include a second impedance device 361 having a designated impedance value and a second switch SW2 capable of electrically connecting the second impedance device 361 and the first conductive portion 327a. For example, the second impedance element 361 may include a first inductor 361a having a 1.0 nH value, a second inductor 361b having a 3.3 nH value, and/or a third inductor 361c having a 5.6 nH value, but is not limited thereto, and the second impedance element 361 may include a capacitor. The second impedance device 361 may be grounded to a ground region (e.g., the ground region G of FIG. 5B) in the second housing (e.g., the second housing 320 of FIG. 5B), thereby electrically connecting the ground region G and the first conductive portion 327a.

According to an embodiment, in response to identifying the second state by the sensor 380, the electronic device 300 may control the resonant frequency of the antenna A2 in the second state to a resonant frequency set as the second frequency by controlling the second impedance matching circuit 360. In an embodiment, the processor 120 may electrically connect any one of the second switch SW2 and the second impedance element 361. By the connection, the first conductive portion 327a and the one inductor may be electrically connected. The processor 120 may control the resonant frequency of the antenna A2 in the second state to the resonant frequency set as the second frequency by electrically connecting the one inductor to the first conductive portion 327a. For example, the second frequency may be a frequency of a low band (e.g., about 700 MHz to about 960 MHz).

In the second state, at least a portion of the first conductive portion 327a of the second side member 325 (e.g., the second side member 325 of FIG. 5B) may be exposed to the outside of the first housing (e.g., the first housing 310 of FIG. 5B), and thus may operate as an antenna radiator for transmitting and/or receiving a radio signal. The electronic device 300 may communicate with an external electronic device by using the antenna A2 in a second state including the first conductive portion 327a.

It is described in FIG. 6 that the resonant frequency of the antenna A1 in the first state is adjusted by the first impedance matching circuit 350 connected to the first conductive portion 327a and in FIG. 7 that the resonant frequency of the antenna A2 in the second state is adjusted by the second impedance matching circuit 360 connected to the first conductive portion 327*a*, but the disclosure is not limited in this respect. According to an embodiment, the first conductive portion 327*a* may be electrically connected to the first impedance matching circuit 350 and the second impedance matching circuit 360. The first impedance matching circuit 350 and the second impedance matching circuit 360 may operate simultaneously to adjust the resonance frequency of the antenna A1 in the first state or the antenna A2 in the second state.

Figure 8:
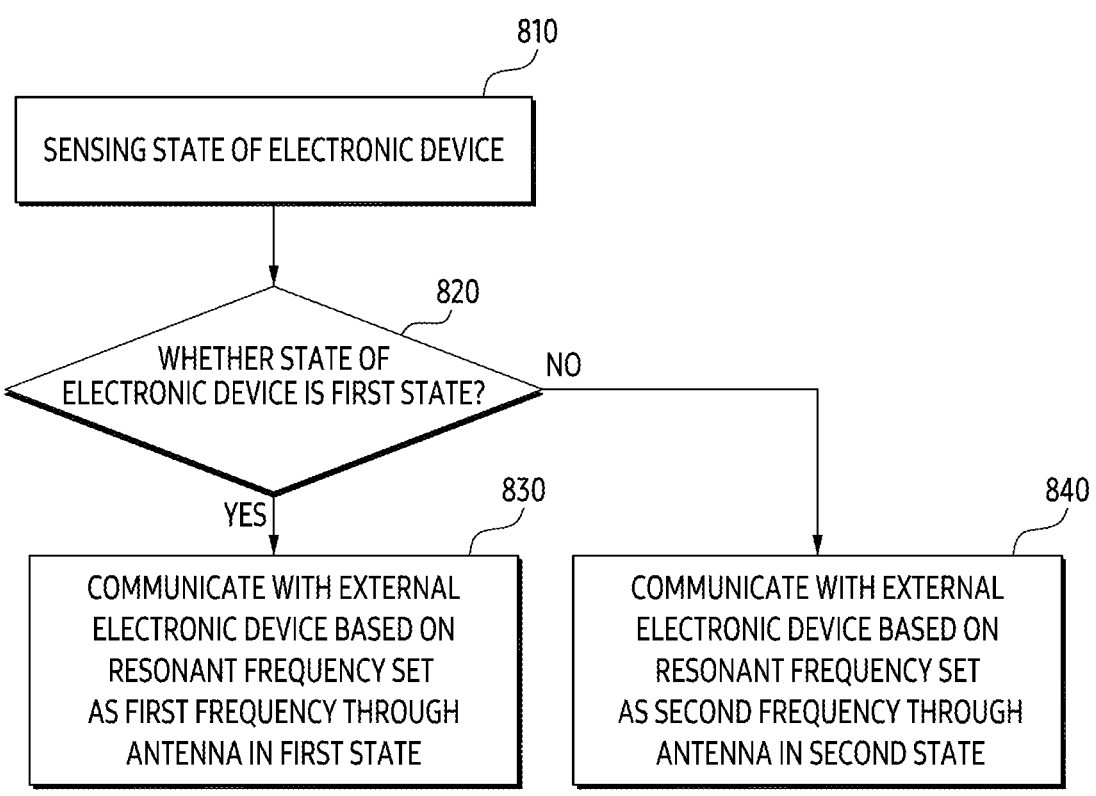
FIG. 8 illustrates an example of an operation of controlling a resonant frequency of an antenna structure by an example electronic device according to various embodiments.

FIG. 8 illustrates an example of an operation of controlling a resonant frequency of an antenna structure by an example electronic device according to various embodiments. The operations illustrated in FIG. 8 may be performed through the operation of the sensor (e.g., the sensor 380 of FIG. 6) and the control of the impedance matching circuit (e.g., the first impedance matching circuit 350 of FIG. 6 or the second impedance matching circuit 360 of FIG. 7) by the processor (e.g., the processor 120 of FIG. 6).

Referring to FIG. 8, in operation 810, the processor 120 may identify the state of the electronic device (e.g., the electronic device 300 of FIG. 3) through the sensor 380. According to an embodiment, the sensor 380 may sense data related to the state of the electronic device 300 and output sensing data related to the state of the electronic device 300.

In operation 810, the processor 120 may identify whether the state of the electronic device 300 is a first state or a second state based on the sensing data. For example, in operation 820, the processor 120 may identify whether the state of the electronic device 300 is a first state that is a slide-in state, based on the sensing data. For another example, in operation 820, the processor 120 may identify whether the state of the electronic device 300 is the second state that is a slide-out state, based on the sensing data. According to an embodiment, the sensing data may, for example, be a magnetic force vector obtained from a hall sensor attached to one of the housings of the electronic device 300. The processor 120 may identify a first state or a second state of the electronic device 300 by comparing designated values corresponding to the first state and the second state with sensing data.

In operation 830, based on identifying that the state of the electronic device 300 is the first state, the processor 120 may communicate with the external electronic device based on the resonant frequency set as the first frequency through the antenna in the first state (e.g., the antenna A1 in the first state of FIG. 6). According to an embodiment, in the first state, the processor 120 may control the resonant frequency of the antenna A1 in the first state to a resonant frequency set to the first frequency by controlling the first impedance matching circuit 350. For example, the processor 120 may electrically connect at least one of the first switch (e.g., the first switch SW1 in FIG. 6) and the plurality of capacitors (e.g., the plurality of capacitors 351 in FIG. 6) so that the resonant frequency of the antenna A1 in the first state is adjusted to the first frequency.

In operation 840, based on identifying that the state of the electronic device 300 is in the second state, the processor 120 may communicate with an external electronic device based on a resonant frequency set to the second frequency through the antenna A2 in the second state (e.g., the antenna A2 in FIG. 7). According to an embodiment, the processor 120 may control the resonant frequency of the antenna A2 in the second state to a resonant frequency set as the second frequency by controlling the second impedance matching circuit 360. For example, the processor 120 may electrically connect at least one of the second switch (e.g., the second switch SW2 in FIG. 7) and the second impedance element (e.g., the second impedance element 361 in FIG. 7) so that the resonant frequency of the antenna A2 in the second state is adjusted to the second frequency.

According to an embodiment, the electronic device 300 may reduce a loss due to mismatching by changing a resonant frequency of the antenna structure for communicating with the external electronic device 300 based on the state of the electronic device 300.

Figure 9:
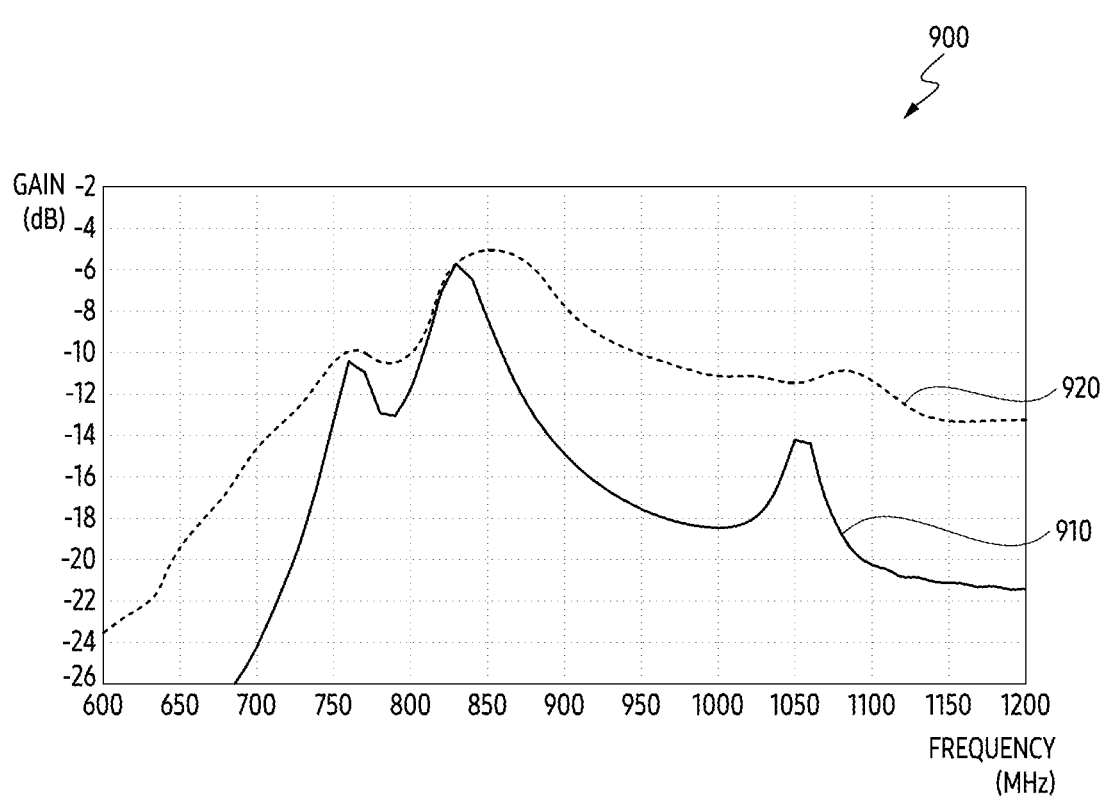
FIG. 9 is a graph illustrating radiation characteristics of an antenna in a first state and an antenna in a second state of an example electronic device, according to various embodiments.

FIG. 9 is a graph illustrating radiation characteristics of an antenna in a first state and an antenna in a second state of an example electronic device, according to various embodiments.

The graph 900 of FIG. 9 illustrates a first graph 910 indicating a gain according to a frequency of the antenna A1 in the first state (e.g., the antenna A1 in the first state of FIG. 5A) and a second graph 920 indicating a gain according to a frequency of an antenna (e.g., the antenna A2 in the second state of FIG. 5B). The horizontal axis of the graph is frequency (unit: MHz), and the vertical axis of the graph is gain (unit: dB).

Referring to FIG. 9, the second graph 920 may have a higher gain than the first graph 910. Since the antenna A2 in the second state is formed by at least one conductive portion (e.g., the first conductive portion 327*a* of FIG. 5B) of the plurality of conductive portions 327 of the second side member (e.g., the second side member 325 of FIG. 5B) exposed to the outside of the first housing (e.g., the first housing 310 of FIG. 5B), restrictions on transmission and reception of radio signals due to overlapping of the second side member 325 and the first housing 310 may be removed. The antenna A2 in the second state may have a wider bandwidth and improved radiation efficiency than the antenna A1 in the first state.

According to an embodiment, in the first state, the processor (e.g., the processor 120 of FIG. 1) may control the resonant frequency of the antenna A1 in the first state to the resonant frequency set as the first frequency by controlling the first impedance matching circuit 350 of FIG. 5A. According to an embodiment, in the second state, the processor may control the resonant frequency of the antenna A2 in the second state to a set resonant frequency as the second frequency by controlling the second impedance matching circuit (e.g., the second impedance matching circuit 360 of FIG. 5B). According to an embodiment, the second frequency may be at least partially different from the first frequency. The first frequency and the second frequency may at least partially overlap. For example, referring to the first graph 910, the processor 120 may control the resonant frequency of the antenna A1 in the first state to a first frequency of about 750 MHz and about 830 MHz. For example, referring to the second graph 920, the antenna A2 in the second state may have a high gain in a frequency band of about 800 MHz to about 900 MHz. The processor 120 may control the resonant frequency of the antenna A2 in the second state to a resonant frequency set as the second frequency in the frequency band of about 800 MHz to about 900 MHz. The electronic device 300 may smoothly perform wireless communication in a low band by communicating with an external electronic device (e.g., the electronic device 102 of FIG. 1) based on the first frequency and the second frequency.

According to an embodiment, the first frequency and the second frequency may overlap each other in a band of about 830 MHz. Since the first frequency and the second frequency are at least partially overlapped, a signal may be stably received when the resonant frequency of the antenna structure is changed according to the state of the electronic device 300. For example, in response to identifying a change from the first state to the second state of the electronic device 300 from the sensor (e.g., the sensor 380 of FIG. 6), the processor 120 may change from a resonant frequency of about 750 MHz or about 830 MHz by the antenna A1 in the first state to a resonant frequency of about 800 MHz to about 900 MHz through the control of the second impedance matching circuit 360 and the antenna A2 in the second state. When having a state between the first state and the second state while the state of the electronic device 300 is being changed, the change of the resonant frequency may be smoothly performed by at least partially overlapping the first frequency and the second frequency. According to an embodiment, the electronic device 300 may reduce a loss of a signal even during a state change.

Figure 10:
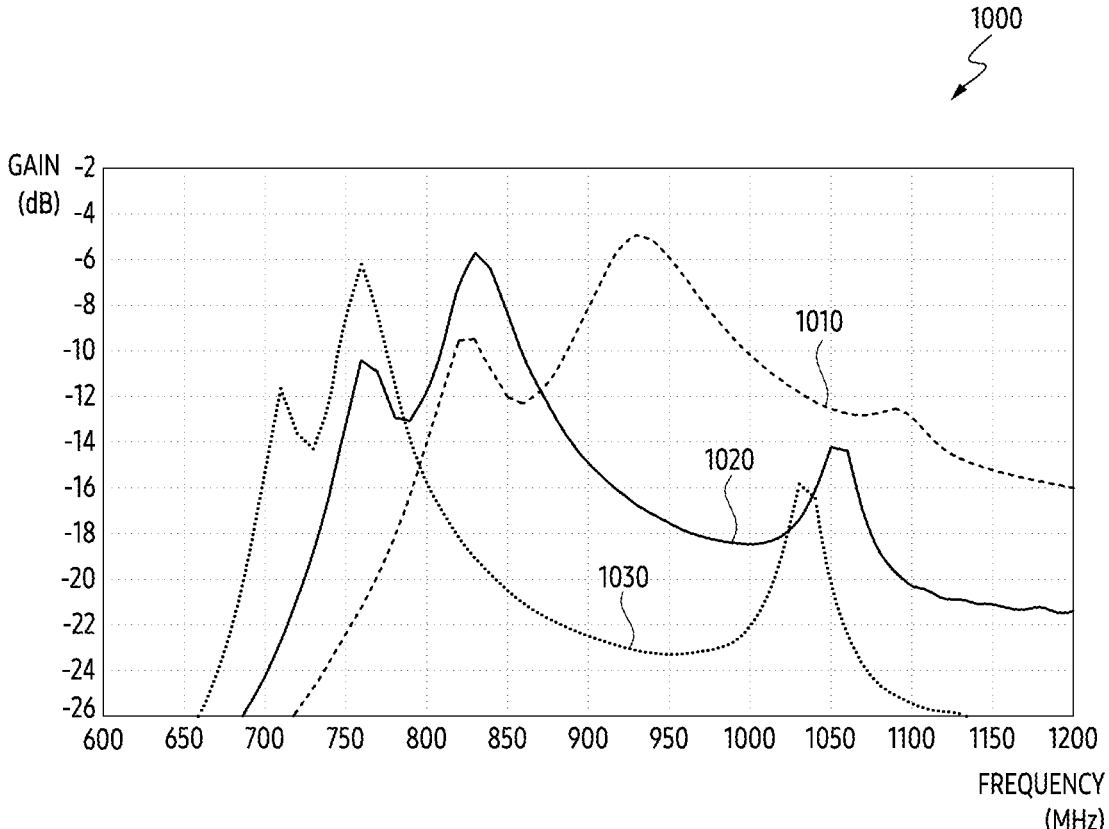
FIG. 10 is a graph illustrating radiation characteristics of an antenna in a first state of an example, according to various embodiments.

FIG. 10 is a graph illustrating radiation characteristics of an antenna in a first state of an example electronic device, according to various embodiments.

The graph 1000 of FIG. 10 illustrates graphs indicating gains of the antenna (e.g., the antenna A1 in a first state of FIG. 6) in a first state with respect to an impedance value of the first impedance matching circuit (e.g., the first impedance matching circuit 350 of FIG. 6). According to an embodiment, the first impedance matching circuit 350 may include a first capacitor with a 1.0 pF value (e.g., the first capacitor 351a of FIG. 6), a second capacitor with a 3.3 pF value (e.g., the second capacitor 351b of FIG. 6), and/or a third capacitor with a 5.6 pF value (e.g., the third capacitor 351c). The first capacitor 351a, the second capacitor 351b, and the third capacitor 351c may be disposed between the first feeding point (e.g., first feeding point P1 in FIG. 5A) of the first conductive portion (e.g., the first conductive portion 327a of FIG. 5A) and the ground region (e.g., the ground region G of FIG. 5A) in the second housing (e.g., the second housing 320 of FIG. 5A). In the first state, the graph 1000 illustrates the first graph 1010 in a state in which a first switch (e.g., the first switch SW1 of FIG. 6) and the first capacitor 351a are electrically connected, the second graph 1020 in a state in which the first switch SW1 and the second capacitor 351b are electrically connected, and the third graph 1030 in a state in which the first switch SW1 and the third capacitor 351c are electrically connected.

Referring to FIG. 10, according to the use environment of the electronic device (e.g., the electronic device 300 of FIG. 4C), the first switch SW1 may control the resonant frequency of the antenna A1 in the first state by being controlled to be selectively connected to any one of the first capacitor 351a, the second capacitor 351b, and the third capacitor 351c. The resonant frequency or frequency band of the antenna A1 in the first state may be adjusted by adjusting the reactance value of the antenna A1 in the first state and/or the coupling between the first conductive portion 327a and the first side member (e.g., the first side member 313 in FIG. 5A) as the capacitance of the first impedance matching circuit 350 increases. For example, a capacitor electrically connected to the first conductive portion 327a may be selected through the first switch SW1 of the first impedance matching circuit 350. For example, referring to the first graph 1010, the resonant frequency of the antenna A1 in the first state may be adjusted to about 930 MHz by electrically connecting the first switch SW1 and the first capacitor 351a. For another example, referring to the second graph 1020, the resonant frequency of the antenna A1 in the first state may be adjusted to about 830 MHz by electrically connecting the first switch SW1 and the second capacitor 351b. For another example, referring to the third graph 1030, the resonant frequency of the antenna A1 in the first state may be adjusted to about 770 MHz by electrically connecting the first switch SW1 and the third capacitor 351c. According to an embodiment, since the impedance value of the matching circuit of the first impedance matching circuit 350 is changed, the resonant frequency of the antenna A1 in the first state may be adjusted according to the state of the electronic device 300.

For example, when receiving a radio signal through the antenna A1 in the first state, the processor 120 may detect a parameter related to a reception quality of a radio signal received by the antenna A1 in the first state and compare the detected parameter with a threshold value. For example, the parameter may include at least one of a received signal strength indication (RSSI), a reference signal received power (RSRP), a received signal code power (RSCP), a reference signal received quality (RSRQ), a signal-to-interference-and-noise ratio (SINR), Ec/Io, a bit error rate (BER), or a packet error rate (PER). When the detected parameter is less than the threshold value, the processor 120 may identify that the antenna A1 in the first state is not accurately resonated at a specific frequency and control the first impedance matching circuit 350. The processor 120 may control the first switch SW1 included in the first impedance matching circuit 350 to be connected to any one of the first capacitor 351a, the second capacitor 351b, and the third capacitor 351c such that the detected parameter is greater than a threshold value. The process may be applied substantially the same when transmitting a radio signal through the antenna A1 in the first state.

Figure 11:
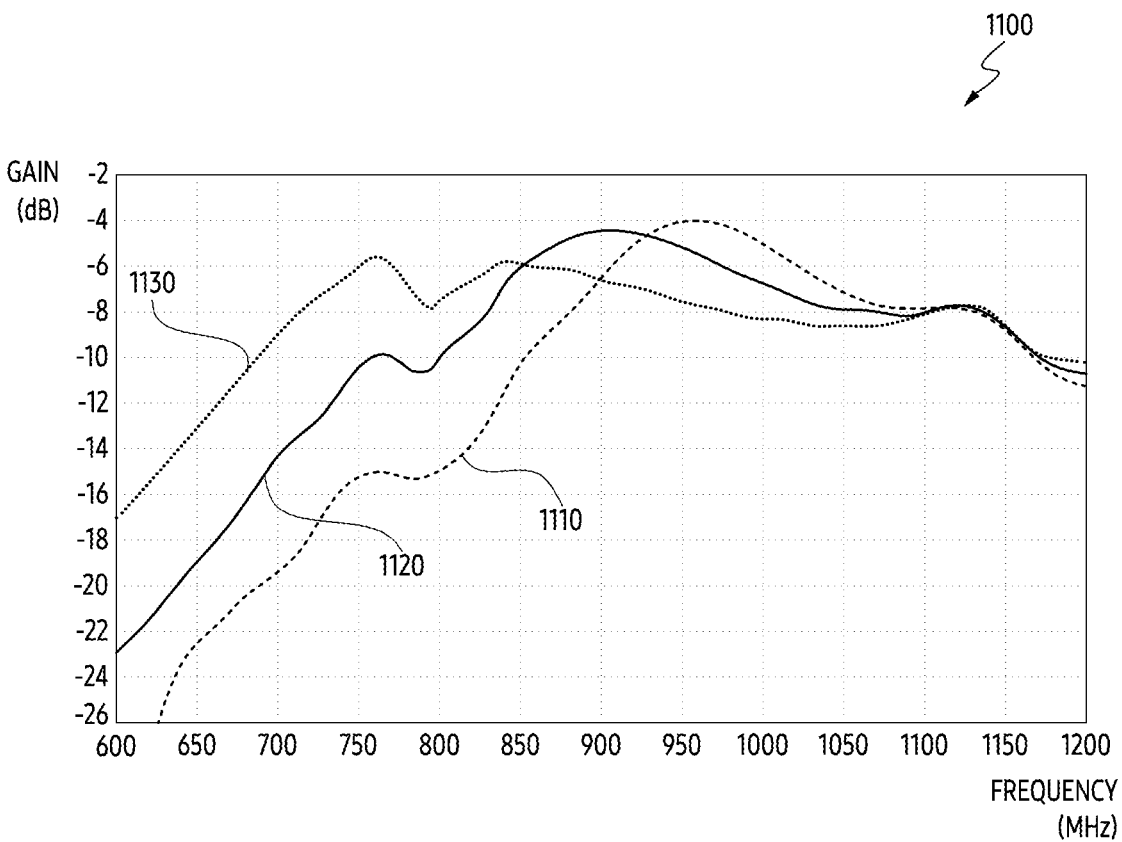
FIG. 11 is a graph illustrating radiation characteristics of an antenna in a second state of an example electronic device, according to various embodiments.

FIG. 11 is a graph illustrating radiation characteristics of an antenna in a second state of an example electronic device, according to various embodiments.

The graph 1100 of FIG. 11 illustrates graphs indicating gains of the antenna (e.g., the antenna A2 in the second state of FIG. 7) in a second state with respect to an impedance value of the second impedance matching circuit (e.g., the second impedance matching circuit 360 of FIG. 7). According to an embodiment, the second impedance matching circuit 360 may include a first inductor (e.g., the first inductor 361a of FIG. 7) having a 1.0 nH value, a second inductor (e.g., the second inductor 361b of FIG. 7) having a 1.8 nH value, and or a third inductor (e.g., the third inductor 361c of FIG. 7) having a 3.3 nH value. The first inductor 361a, the second inductor 361b, and the third inductor 361c may be disposed between the first feeding point (e.g., the first feeding point P1 of FIG. 5B) of the first conductive portion (e.g., the first conductive portion 327a of FIG. 5B) and the ground region (e.g., the ground region G of FIG. 5B) in the second housing (e.g., the second housing 320 of FIG. 5B). In the second state, the graph 1100 includes a first graph 1110 in a state in which a second switch (e.g., the second switch SW2 of FIG. 7) and the first inductor 361a are electrically connected, a second graph 1120 in a state in which the second switch SW2 and the second inductor 361b are electrically connected, and a third graph 1130 in a state in which the second switch SW2 and the third inductor 361c are electrically connected.

Referring to FIG. 11, according to the use environment of the electronic device (e.g., the electronic device 300 of FIG. 5B), the resonant frequency of the antenna A2 in the second state may be controlled by controlling the second switch SW2 to be selectively connected to any one of the first inductor 361a, the second inductor 361b, and the third inductor 361c. The resonant frequency of the antenna A2 in the second state may be reduced by adjusting the reactance value of the antenna A2 in the second state, as the inductance of the second impedance matching circuit 360 increases. For example, referring to the first graph 1110, the resonant frequency of the antenna A2 in the second state may be adjusted to about 950 MHz by electrically connecting the second switch SW2 and the first inductor 361*a*. For another example, referring to the second graph 1120, the resonant frequency of the antenna A2 in the second state may be adjusted to about 880 MHz by electrically connecting the second switch SW2 and the second inductor 361*b*. For still another example, referring to the third graph 1130, the resonant frequency of the antenna A2 in the second state may be adjusted to about 820 MHz by electrically connecting the second switch SW2 and the third inductor 361*c*.

For example, when receiving a radio signal through the antenna A2 in the second state, the processor 120 may detect a parameter related to the reception quality of the radio signal received by the antenna A2 in the second state and compare the detected parameter with a threshold value. When the detected parameter is less than the threshold value, the processor 120 may identify that the antenna A2 in the second state is not accurately resonated at a designated frequency and control the second impedance matching circuit 360. The processor 120 may control the second switch SW2 included in the second impedance matching circuit 360 to be connected to any one of the first inductor 361*a*, the second inductor 361*b*, and the third inductor 361*c* so that the detected parameter becomes greater than the threshold. The process may be applied substantially the same when transmitting a wireless signal through the antenna A2 in the second state.

According to an embodiment, the electronic device 300 may change the resonant frequency of the antenna A1 in the first state by controlling the impedance value of the first impedance matching circuit 350 in the first state. According to an embodiment, the electronic device may change the resonant frequency of the antenna A2 in the second state by controlling the impedance value of the second impedance matching circuit 360 in the second state.

According to an embodiment, the relative position of the second side member 325 to the first housing 310 may be changed by the sliding movement of the second housing 320. According to an embodiment, the path of the electrical signal of the antenna A2 in the second state may be shorter than the path of the electrical signal of the antenna A1 in the first state. Since the antenna A1 in the first state is formed by the first conductive portion 327*a* and the first housing 310 electromagnetically connected to the first conductive portion 327*a* and the antenna A2 in the second state is formed by the first conductive portion 327*a*, a difference in the length of the path of the electrical signal may be generated. According to an embodiment, the resonant frequency of the antenna A2 in the second state may be formed in a band higher than the resonant frequency of the antenna A1 in the first state. According to an embodiment, since the resonant frequency of the antenna structure is changed based on the state of the electronic device 300, the electronic device 300 may adjust the resonant frequencies of each of the antennas A1 in the first state and the antennas A2 in the second state through the first impedance matching circuit 350 or the second impedance matching circuit 360. According to an embodiment, the electronic device 300 may reduce loss due to mismatching and improve radiation performance by adjusting the resonant frequency through the first impedance matching circuit 350 or the second impedance matching circuit 360 without physical deformation of the antenna A1 in the first state or the antenna A2 in the second state.

Referring to FIGS. 10 and 11, the range of resonant frequencies of the antenna A1 in the first state to be adjusted through a switching operation in the first state may be similar to the range of resonant frequencies of the antenna A2 in the second state adjusted through a switching operation in the second state. Referring to FIG. 10, in a first state, a resonant frequency adjusted through switching may be 750 MHz, 830 MHz, or 930 MHz. Referring to FIG. 11, in the second state, the resonant frequencies adjusted through switching may be 760 MHz, 900 MHZ, and 950 MHz. The communication performance of the low band of the electronic device in the first state and the second state may be secured.

Figure 12A:
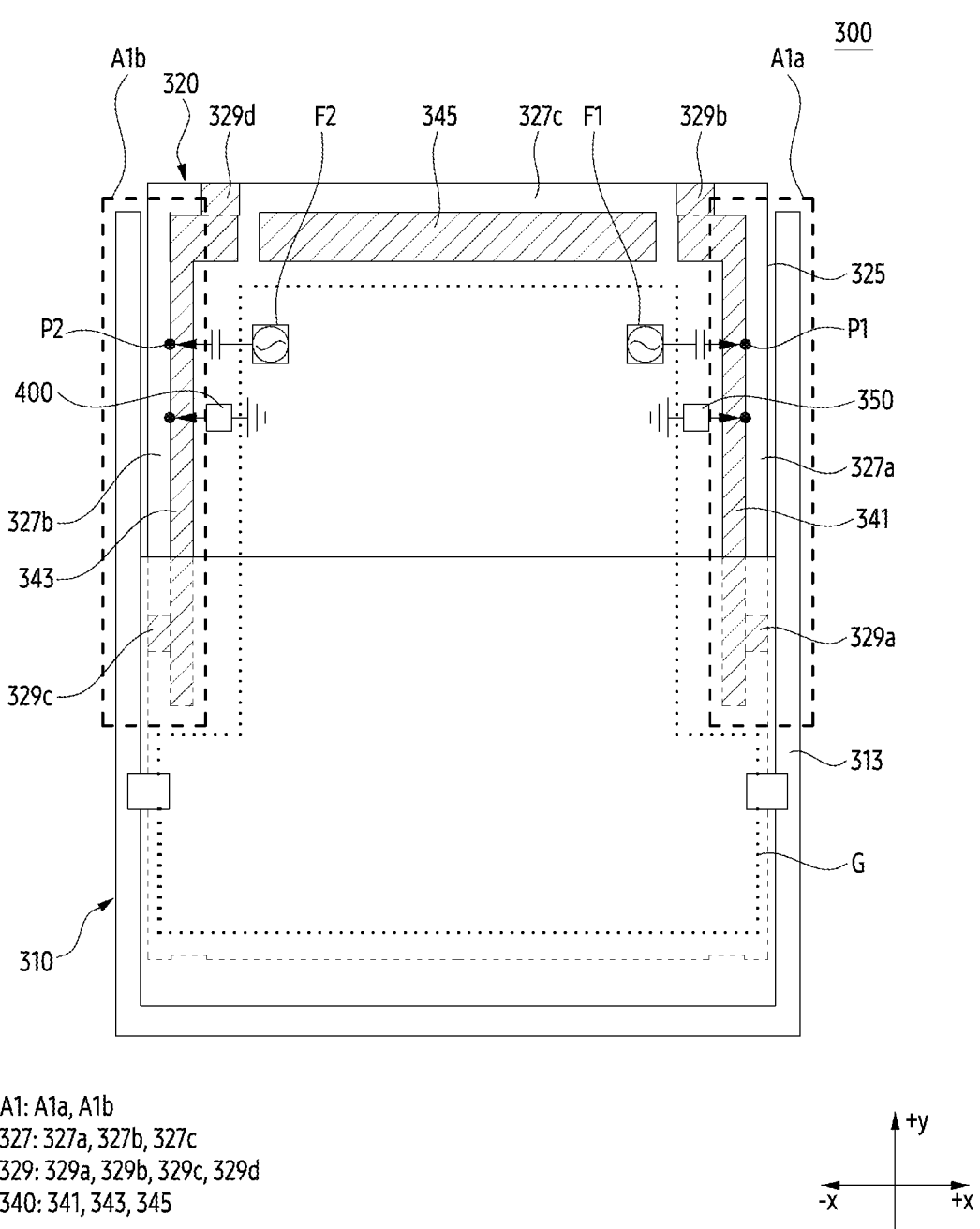
FIG. 12A is a view schematically illustrating a first state of an example electronic device according to various embodiments.
Figure 12B:
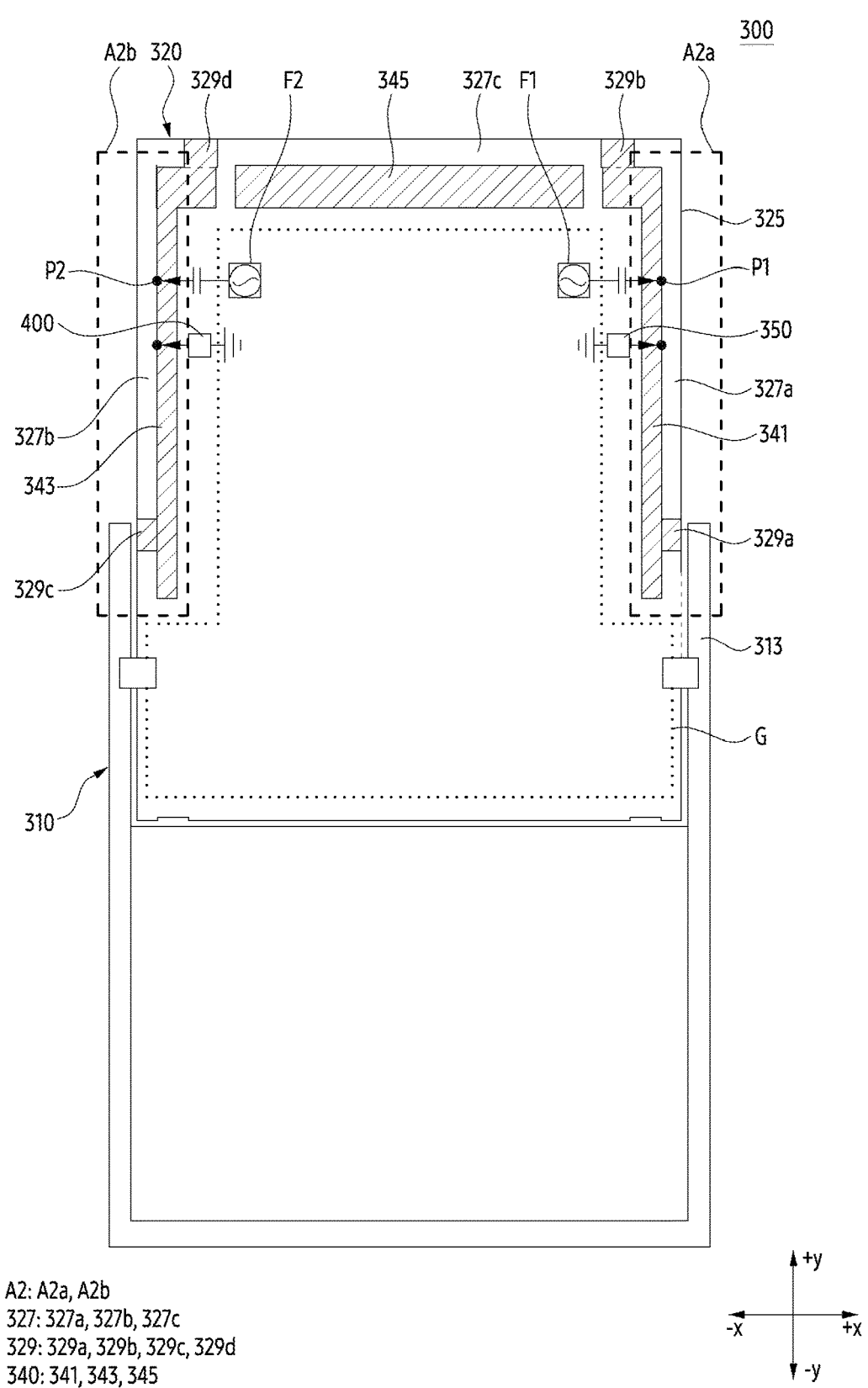
FIG. 12B is a view schematically illustrating a second state of an example electronic device according to various embodiments.
Figure 13:
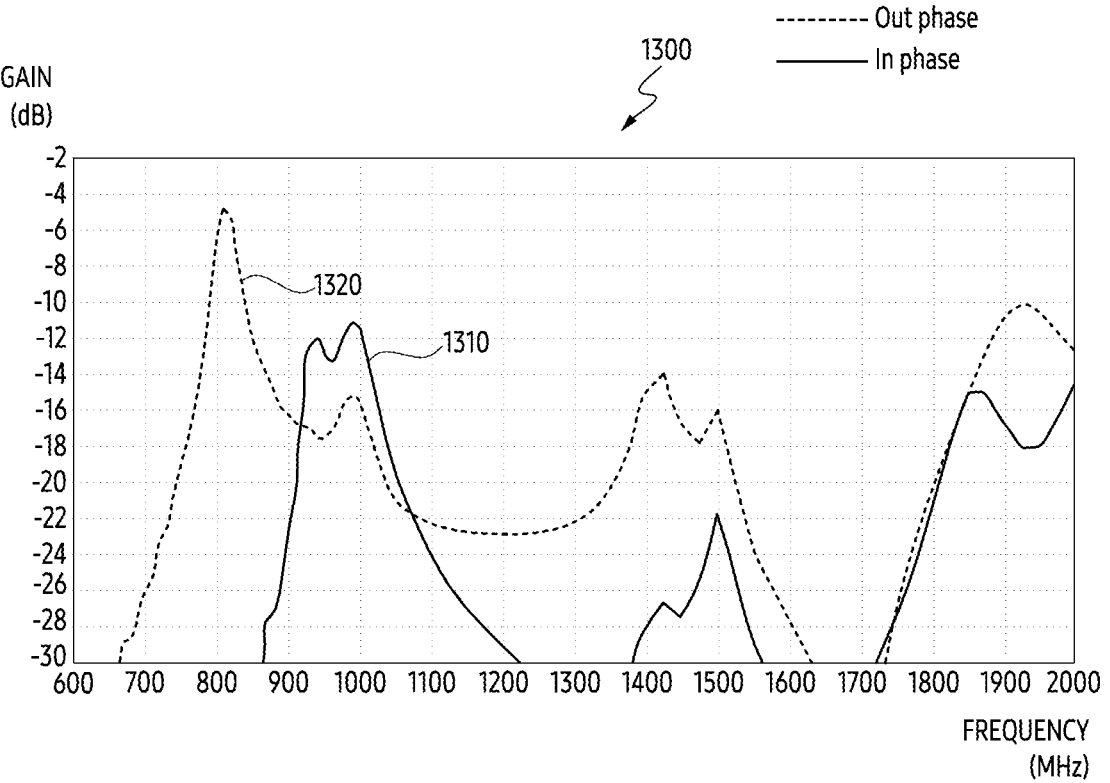
FIG. 13 is a graph illustrating radiation characteristics according to a phase of a current applied to a feeding point of an example electronic device, illustrated in FIG. 12A.

FIG. 12A is a view schematically illustrating a first state of an example electronic device according to various embodiments, FIG. 12B is a view schematically illustrating a second state of an example electronic device according to various embodiments, and FIG. 13 is a graph illustrating radiation characteristics according to a phase of a current applied to a feeding point of an example electronic device, illustrated in FIG. 12A.

According to an embodiment, referring to FIG. 12A, the second side member 325 of the electronic device 300 may include a plurality of conductive portions 327 and a plurality of non-conductive portions 329. According to an embodiment, in the first state, the second side member 325 may include the first side member 313, a first conductive portion 327*a* spaced apart in a second direction (e.g., a +x direction or a −x direction), a second conductive portion 327*b* facing the first conductive portion 327*a*, and a third conductive portion 327*c* disposed between the first conductive portion 327*a* and the second conductive portion 327*b*. The plurality of non-conductive portions 329 may include a first non-conductive portion 329*a* disposed at one end of the first conductive portion 327*a* and a second non-conductive portion 329*b* disposed between another end of the first conductive portion 327*a* and the second conductive portion 327*b*. According to an embodiment, the second conductive portion 327*b* may include a portion of the second side member 325 extending in the first direction and a portion of the second side member 325 extending in the second direction. Since the plurality of non-conductive portions 329 are disposed between a plurality of conductive portions 327, the second side member 325 may have a segmented structure.

According to an embodiment, the electronic device 300 may include a first feeding point P1 disposed on the first conductive portion 327*a* and a second feeding point P2 disposed on the second conductive portion 327*b*. According to an embodiment, power may be applied from the first feeding portion F1 to the first feeding point P1, and power may be applied from the second feeding portion F2 to the second feeding point P2.

According to an embodiment, the at least one slit 340 may include a first slit 341 adjacent to the first conductive portion 327*a* of the second side member 325, a second slit 343 adjacent to the second conductive portion 327*b* of the second side member 325, and a third slit 345 adjacent to the third conductive portion 327*c* of the second side member 325. According to an embodiment, the first slit 341 may face the second slit 343.

According to an embodiment, the antenna A1 in the first state may include a first-a antenna structure A1*a* formed by coupling the first conductive portion 327*a* and the second side member 325 by applying power to the first feeding point P1, and a first b antenna structure A1*b* formed by coupling the second conductive portion 327*b* and the second side member 325 by applying power to the second feeding point P2. According to an embodiment, in the first state, the processor (e.g., the processor 120 of FIG. 1) may be configured to communicate with an external electronic device through the first-a antenna structure A1*a* and/or the first-b antenna structure A1*b*.

According to an embodiment, the electronic device 300 may include a first impedance matching circuit 350 disposed between the ground region G in the second housing 320 and the first conductive portion 327*a* and a third impedance matching circuit 400 disposed between the ground region G in the second housing 320 and the second conductive portion 327*b*. The first impedance matching circuit 350 may be electrically connected to the first conductive portion 327*a*, and the third impedance matching circuit 400 may be electrically connected to the second conductive portion 327*b*.

According to an embodiment, the resonant frequency of the first a-antenna structure A1*a* may be adjusted by the first impedance matching circuit 350, and the resonant frequency of the first b-antenna structure A1*b* may be adjusted by the third impedance matching circuit 400.

Referring to FIG. 12B, according to an embodiment, in the second state, in the electronic device 300, the antenna A2 in a second state including a first conductive portion 327*a* that is electromagnetically disconnected from the first side member 313 may be formed. According to an embodiment, the antenna A2 in the second state may include a second-a antenna structure A2*a* in which the first conductive portion 327*a* operates alone by applying power to the first feeding point P1, and a second-b antenna structure A2*b* in which the second conductive portion 327*b* operates alone by applying power to the second feeding point P2. According to an embodiment, in the second state, the processor (e.g., the processor 120 of FIG. 1) may be configured to communicate with an external electronic device through the second-a antenna structure A2*a* and/or the second-b antenna structure A2*b*. For example, the second-a antenna structure A2*a* may be referred to as an IFA fed to the first feeding point P1, and the second-b antenna structure A2*b* may be referred to as an IFA fed to the second feeding point P2.

The graph 1300 of FIG. 13 includes a first graph 1310 indicating a gain according to a frequency of the antenna A1 in a first state in which a current of the same phase is applied to the first feeding point P1 and the second feeding point P2 and a second graph 1320 indicating a gain according to a frequency of the antenna A1 in a first state in which a current of an opposite phase is applied to the first feeding point P1 and the second feeding point P2.

Referring to FIG. 13, in a frequency range (for example, about 700 MHz to about 960 MHz) of a low band, the second graph 1320 may have a higher gain than the first graph 1310. The maximum gain of the first graph 1310 may be about −11.0 dB, and the maximum gain of the second graph 1320 may be about −4.2 dB. According to an embodiment, in the first state, in the electronic device 300, when a current of an opposite phase is applied to the first feeding point P1 and the second feeding point P2, the radiation performance may be improved. According to an embodiment, since the bandwidth of the second graph 1320 may be wider than the bandwidth of the first graph 1310, the antenna A1 in the first state may secure wider coverage when current of opposite phases is applied to the first feeding point P1 and the second feeding point P2.

Figure 14:
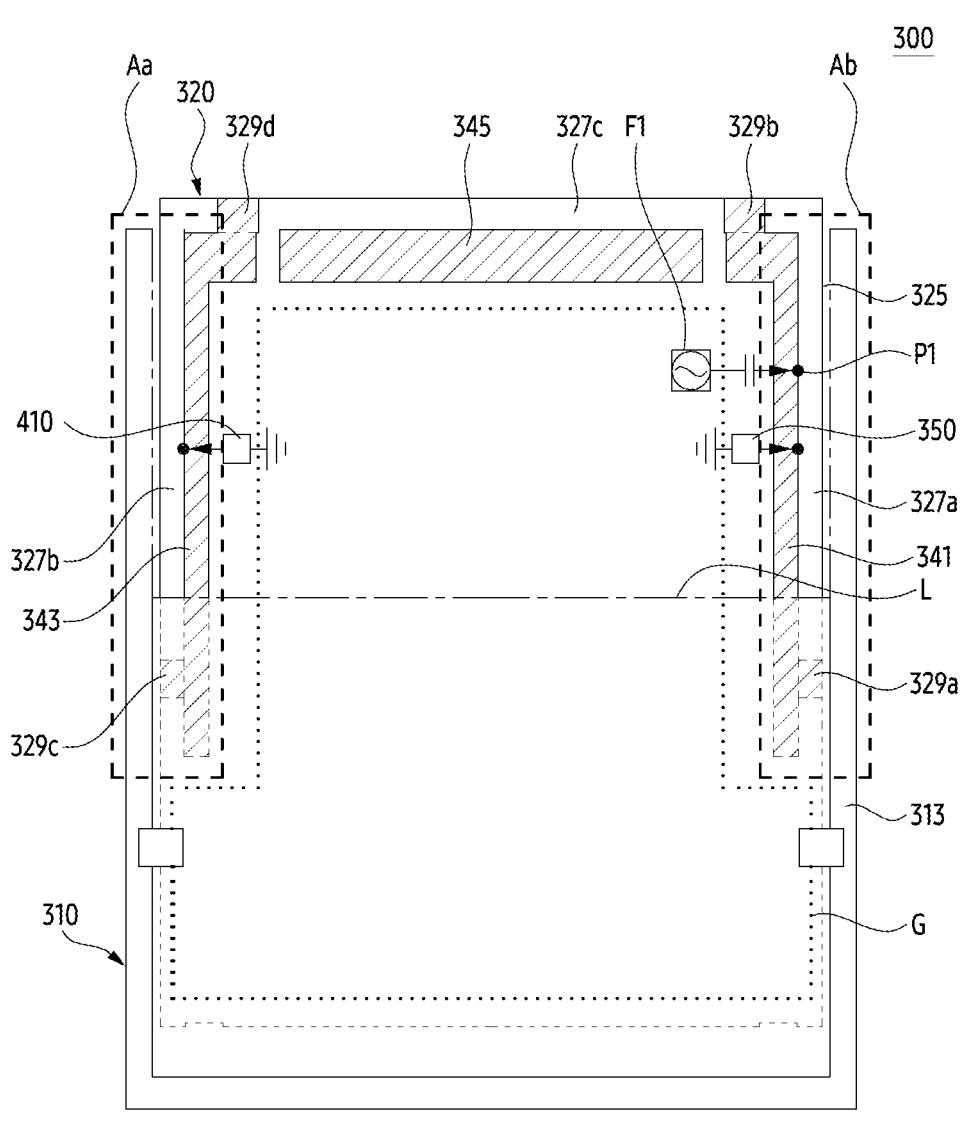
FIG. 14 is a view schematically illustrating a first state of an example electronic device according to various embodiments.
Figure 15:
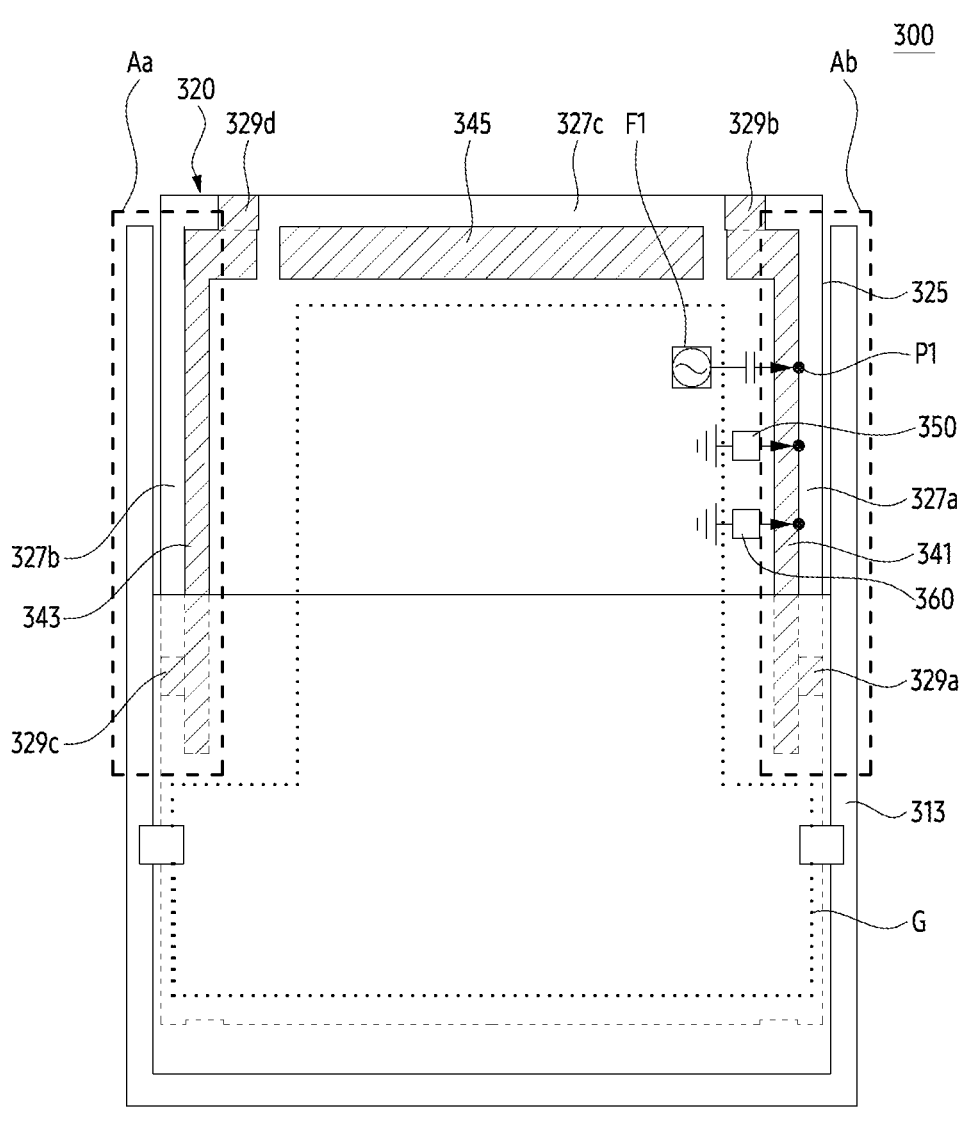
FIG. 15 is another view schematically illustrating a first state of an example electronic device, according to various embodiments.

FIG. 14 is a view schematically illustrating a first state of an example electronic device according to various embodiments and FIG. 15 is another view schematically illustrating a first state of an example electronic device, according to various embodiments.

Referring to FIG. 14, according to an embodiment, the electronic device 300 may operate the antenna A1 in the first state through the first feeding point P1 electromagnetically connected to the first conductive portion 327*a*. The electronic device 300 illustrated in FIG. 14 may include a first feeding point P1 disposed on the first conductive portion 327*a*. The electronic device 300 illustrated in FIG. 14 may include only a first feeding point P1 electromagnetically connected to the first conductive portion 327*a*.

When compared with the electronic device 300 illustrated in FIG. 12, the electronic device 300 illustrated in FIG. 14 may be substantially the same except for including a single feeding point (e.g., a first feeding point P1). For example, the electronic device 300 illustrated in FIG. 14 may include a first impedance matching circuit 350 disposed between the ground region G in the second housing 320 and the first conductive portion 327*a* and a fourth impedance matching circuit 410 disposed between the ground region G in the second housing 320 and the second conductive portion 327*b*.

According to an embodiment, the radiation current L may be induced along the surface of the first housing 310 by the coupling of the first conductive portion 327*a* and the first side member 313 and the coupling of the second conductive portion 327*b* and the first side member 313. For example, the induced radiation current L may flow to the second region Ab formed by coupling the first conductive portion 327*a* and the first side member 313 after passing through the first housing 310 from the first region Aa formed by the coupling of the second conductive portion 327*b* and the first side member 313. The antenna A1 in a first state having a resonant frequency of a low band may be formed by being generated by the radiation current L (generally, the U-shaped radiation current L). According to an embodiment, when power is applied to the first feeding point P1, a phase difference may be generated in the first housing 310 electromagnetically connected to the first conductive portion 327*a* and a current flow may be formed in the first housing 310 due to a phase difference. In substantially the same manner as the electronic device 300 illustrated in FIG. 12 including the first feeding point P1 and the second feeding point P2 to which currents having different phases are applied, the electronic device 300 including the first feeding point P1 may have a path of a current flowing along the first housing 310.

Referring to FIG. 15, the first impedance matching circuit 350 and the second impedance matching circuit 360 may be disposed between a ground region in the second housing 320 and the first conductive portion 327*a*. According to an embodiment, the first impedance matching circuit 350 and the second impedance matching circuit 360 may be electrically connected to the first conductive portion 327*a*. The electronic device 300 may include a single feeding point (e.g., a first feeding point P1). When a first impedance matching circuit 350 and a second impedance matching circuit 360 electrically connected to the first conductive portion 327*a* are included, the electronic device 300 may have a limited arrangement space within the electronic device 300. According to an embodiment, both the first impedance matching circuit 350 and the second impedance matching circuit 360 may be disposed to be electrically connected to the first conductive portion 327*a* based on the arrangement space of electronic components inside the electronic device 300.

Referring back to FIG. 14, in the case of the electronic device 300, since the first impedance matching circuit 350 is disposed to be electrically connected to the first conductive portion 327a, and the second impedance matching circuit 360 is disposed to be electrically connected to the second conductive portion 327b, a spatial restriction inside the electronic device 300 may be reduced.

Figure 16A:
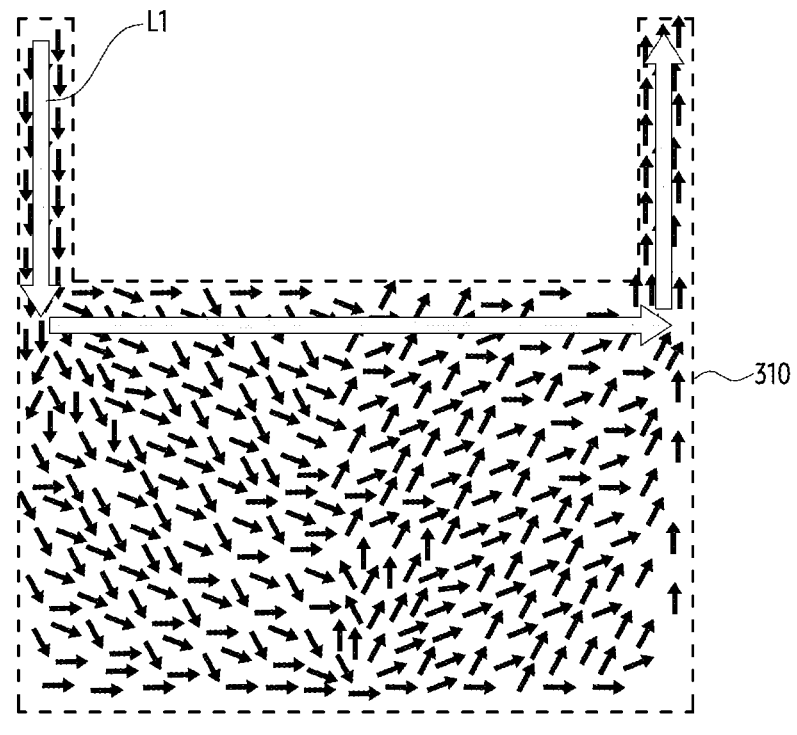
FIG. 16A schematically illustrates a current flowing through the first housing of the example electronic device illustrated in FIG. 12A.
Figure 16B:
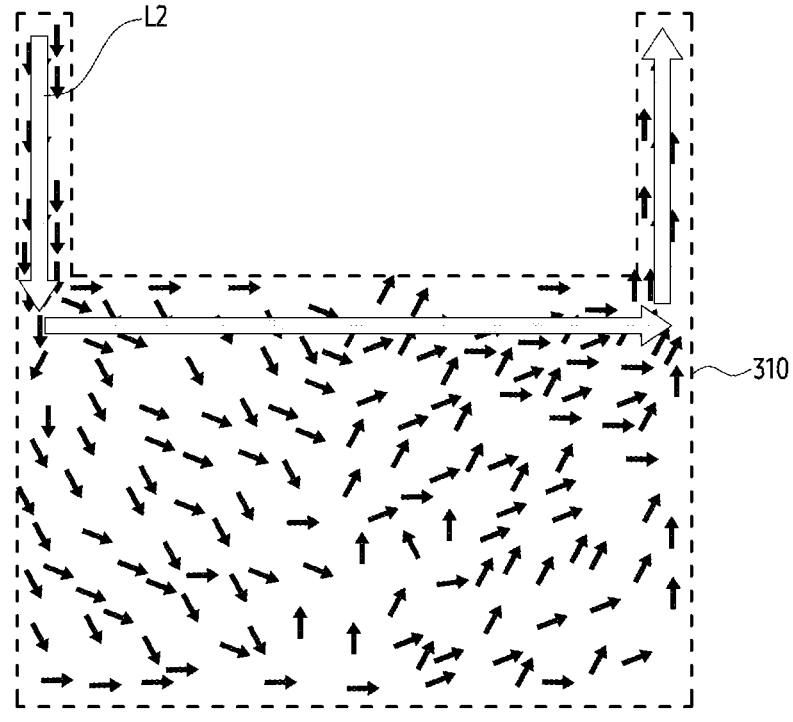
FIG. 16B schematically illustrates a current flowing through the first housing of the example electronic device illustrated in FIG. 14 or 15.

FIG. 16A schematically illustrates a current flowing through the first housing of the example electronic device illustrated in FIG. 12A and FIG. 16B schematically illustrates a current flowing through the first housing of the example electronic device illustrated in FIG. 14 or 15.

Referring to FIG. 16A, when power is applied to the first feeding point (e.g., the first feeding point P1 of FIG. 12A) and the second feeding point (e.g., the second feeding point P2 of FIG. 12A), respectively, of the electronic device (e.g., the electronic device 300 of FIG. 12A), a current may flow along the first housing (e.g., the first housing 310 of FIG. 12A) by coupling the first conductive portion (e.g., the first conductive portion 327a of FIG. 12A) and the first side member (e.g., the first side member 313 of FIG. 12A) and coupling the second conductive portion (e.g., the second conductive portion 327b of FIG. 12A) and the first side member 313. According to an embodiment, when the same signals of the same frequency are simultaneously fed to the first feeding point P1 and the second feeding point P2 in opposite phases, a current path L1 according to a phase difference may be formed in the first housing 310. For example, due to phase differences, a current path L1, which is a path from a region corresponding to the second feeding point P2 of the first housing 310 to a region corresponding to the first feeding point P1 of the first housing 310, may be formed. As the phase of the AC current periodically changes, the direction of the path may periodically change in an opposite direction. As signals of opposite phases are respectively fed to the first feeding point P1 and the second feeding point P2, a current path L1 flowing along the first housing 310 may be formed. According to an embodiment, in the electronic device 300 in the first state, the first housing may be operated as an antenna by the current formed in the first housing 310.

Referring to FIG. 16B, when a signal is fed through a first feeding point (e.g., the first feeding point P1 of FIG. 14) of the electronic device illustrated in FIG. 14, a current may flow along the first housing 310 by coupling the first conductive portion (e.g., the first conductive portion 327a of FIG. 14) to the first side member (e.g., the first side member 313 of FIG. 14). According to an embodiment, the current path L2 may extend from the first slit 341 to the second slit 343 along the surface of the first housing 310 by interaction with the second slit (e.g., the second slit 343 of FIG. 14) facing the first slit (e.g., the first slit 341 of FIG. 14). According to an embodiment, since the electronic device 300 includes a first slit 341 and a second slit 343 facing each other, a current path L2 that entirely flows through the first housing 310 may be formed.

Referring to FIG. 16B, according to an embodiment, even when power is applied through the first feeding point P1, the electronic device 300 may have a path L2 of a current flowing along the first housing 310. According to an embodiment, even when power is applied only through the first feeding point P1, an antenna including a current path L2 flowing along the surface of the first housing 310 may be formed. According to an embodiment, in a case that disposing a plurality of feeding points due to a limitation of an arrangement space, or a design limitation of internal electronic components is difficult, the electronic device 300 may provide an antenna having a current path L2 similar to the current path L1 of FIG. 16A, even when it includes a single feeding point (e.g., a first feeding point P1).

Figure 17A:
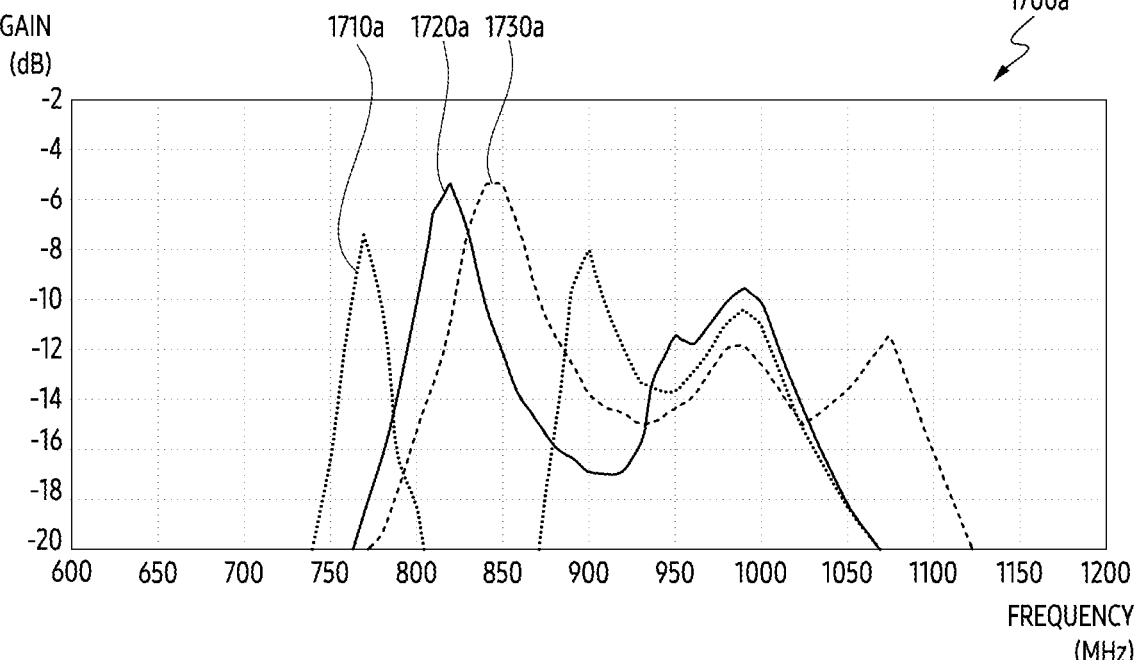
FIG. 17A is a graph illustrating radiation characteristics of an antenna in a first state of the example electronic device illustrated in FIG. 14.
Figure 17B:
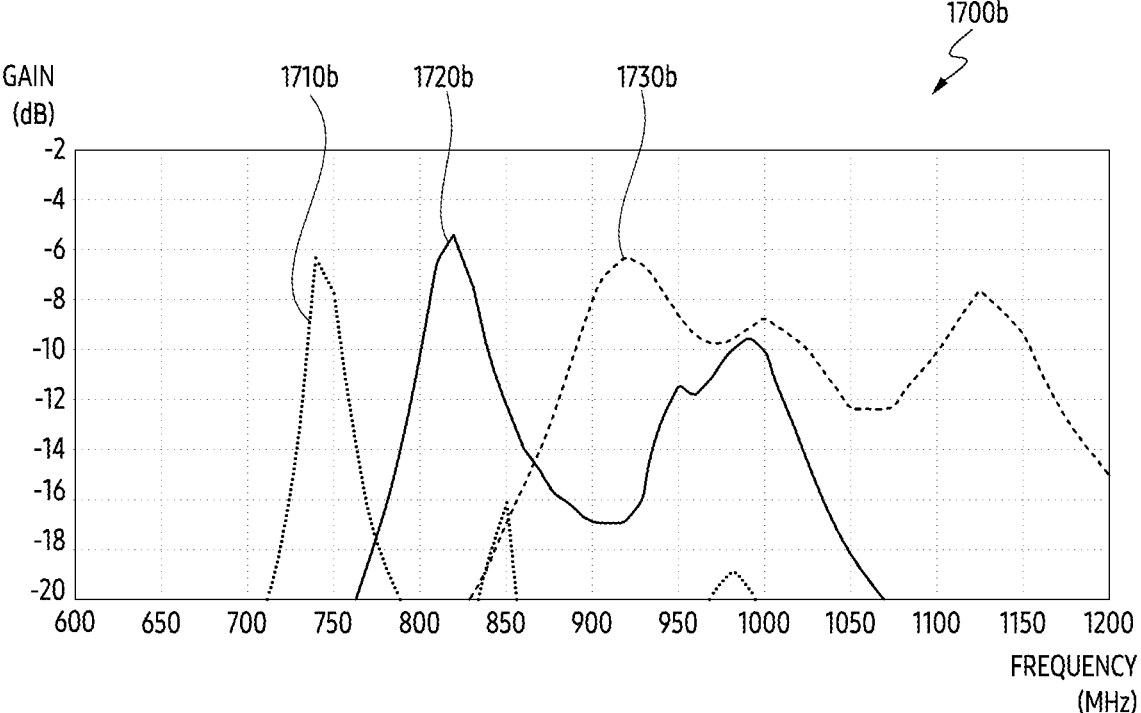
FIG. 17B is a graph illustrating radiation characteristics of an antenna in a first state of the example electronic device illustrated in FIG. 15.

FIG. 17A is a graph 1700a illustrating radiation characteristics of an antenna in a first state of the example electronic device illustrated in FIG. 14 and FIG. 17B is a graph 1700b illustrating radiation characteristics of an antenna in a first state of the example electronic device illustrated in FIG. 15.

The electronic device 300 of FIG. 14 (e.g., the electronic device 300 of FIG. 14) may include a first impedance matching circuit (e.g., the first impedance matching circuit 350 of FIG. 14) electrically connected to a first conductive portion (e.g., the first conductive portion 327a of FIG. 14) and a second impedance matching circuit (e.g., the second impedance matching circuit 360 of FIG. 14) electrically connected to the second conductive portion (e.g., the second conductive portion 327b of FIG. 14). When power is applied through the first feeding point (e.g., the first feeding point P1 of FIG. 14), the antenna A1 in the first state (e.g., the antenna A1 in the first state of FIG. 14) may be operated. The processor (e.g., the processor 120 of FIG. 1) may adjust the reactance value of the first-a antenna structure A1a by controlling the first impedance matching circuit 350. The processor 120 may adjust the reactance value of the first b antenna structure A1b by controlling the second impedance matching circuit 360. The resonant frequency of the antenna A1 in the first state may be adjusted by adjusting the reactance value.

Referring to FIG. 17A, the graph 1700a includes a first graph 1710a indicating radiation characteristics of the antenna A1 in the first state based on the first reactance value, a second graph 1720a indicating radiation characteristics of the antenna A1 in the first state based on the second reactance value, and a third graph 1730a indicating radiation characteristics of the antenna A1 in the first state based on the third reactance value. Referring to FIG. 17A, the electronic device illustrated in FIG. 14 may adjust the resonant frequency of the antenna A1 in the first state by changing the reactance value of the antenna A1 in the first state to a first reactance, a second reactance, or a third reactance through the first impedance matching circuit 350 and the second impedance matching circuit 360.

The electronic device (e.g., the electronic device 300 of FIG. 15) illustrated in FIG. 15 may include a first impedance matching circuit (e.g., the first impedance matching circuit 350 of FIG. 15) electrically connected to the first conductive portion (e.g., the first conductive portion 327a of FIG. 15) and a second impedance matching circuit (e.g., the second impedance matching circuit 360 of FIG. 15). The antenna A1 in the first state (e.g., the antenna A1 in the first state in FIG. 15) may be operated by applying power through the first feeding point (e.g., the first feeding point P1 in FIG. 15). The processor (e.g., the processor 120 of FIG. 1) may control the first impedance matching circuit 350 and/or the second impedance matching circuit 360 to adjust the reactance value of the antenna A1 in the first state. The resonant frequency of the antenna A1 in the first state may be adjusted by adjusting the reactance value.

Referring to FIG. 17B, the graph 1700b includes a first graph 1710b illustrating radiation characteristics of an antenna in a first state based on a fourth reactance value, a second graph 1720b illustrating radiation characteristics of an antenna in a first state based on a fifth reactance value, and a third graph 1730b illustrating radiation characteristics of an antenna in a first state based on a sixth reactance value. According to an embodiment, the electronic device 300 illustrated in FIG. 15 may adjust the resonant frequency of the antenna in the first state by changing the reactance value of the antenna A1 in the first state to a fourth reactance, a fifth reactance, or a sixth reactance through the first impedance matching circuit 350 and/or the second impedance matching circuit 360.

Comparing the graph 1700a and the graph 1700b, a shift width of the resonant frequency of the graph 1700a may be narrower than a shift width of the resonant frequency of the graph 1700b. Since the reactance value of the first-a antenna structure A1a may be adjusted through the first impedance matching circuit 350, and the reactance value of the first-b antenna structure A1b may be adjusted through the second impedance matching circuit 360, the electronic device 300 illustrated in FIG. 14 may be capable of finely adjusting a resonant frequency.

Comparing the graph 1700a and the graph 1700b, the bandwidth of the graph 1700b may be wider than the bandwidth of the graph 1700a. Since the reactance value of the antenna A1 in the first state of one side is adjusted through the first impedance matching circuit 350 and the second impedance matching circuit 360, the electronic device 300 illustrated in FIG. 15 may have a wide bandwidth of the antenna A1 in the first state.

The above operations may be applied substantially the same to the antenna A2 in the second state in the second state.

Figure 18:
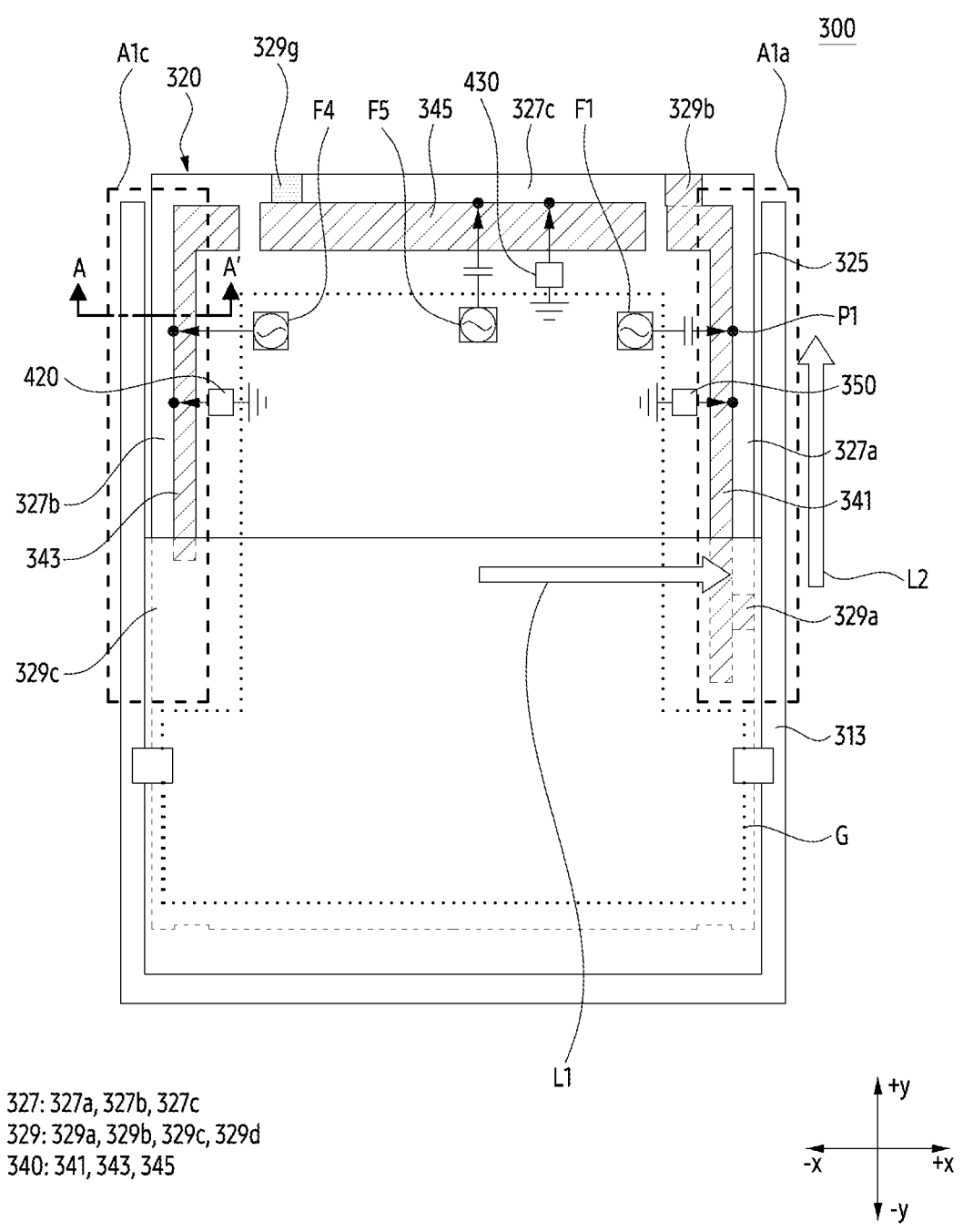
FIG. 18 is a diagram illustrating a first state of an example electronic device according to various embodiments.
Figure 19:
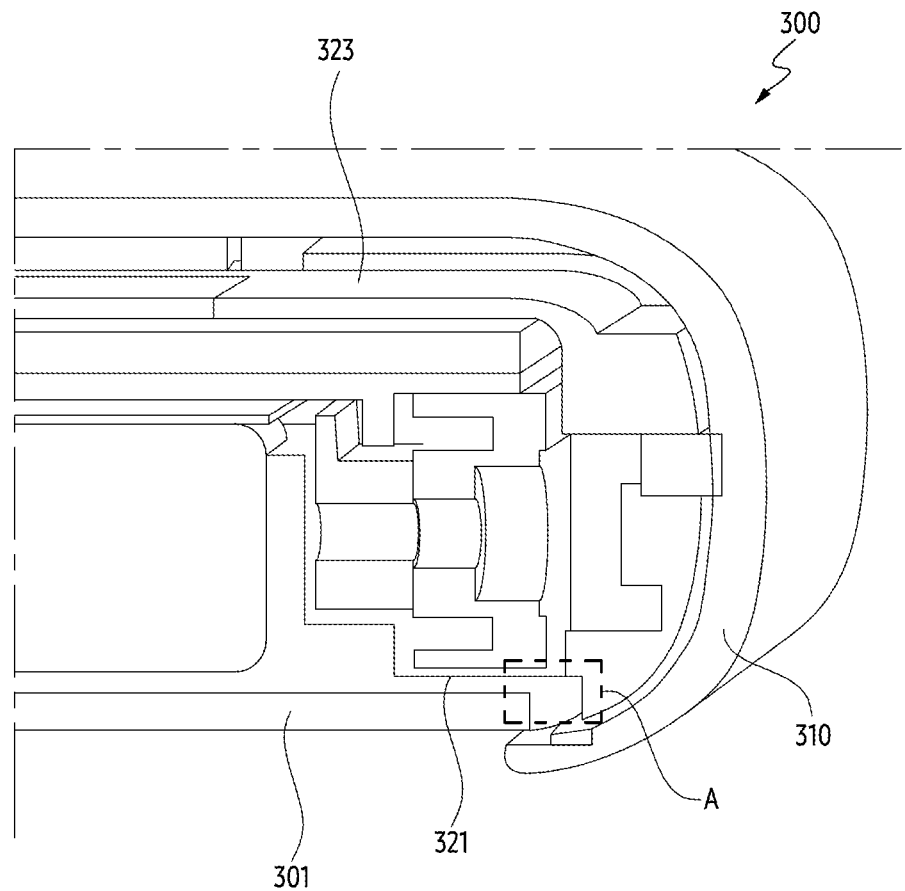
FIG. 19 is a cross-section view cut along A-A' of FIG. 18.

FIG. 18 is a diagram illustrating a first state of an example electronic device according to various embodiments and FIG. 19 is a cross-section view cut along A-A' of FIG. 18.

Referring to FIG. 18, according to an embodiment, the electronic device 300 may include a first housing 310, a second housing 320 slidably coupled to the first housing 310 in a first direction (+y direction or −y direction), and a processor (e.g., the processor 120 of FIG. 1). Hereinafter, a description overlapping the description of FIGS. 4A, 4B, and to 4C will not be repeated.

According to an embodiment, the second side member 325 may include the plurality of conductive portions 327 and the plurality of non-conductive portions 329. According to an embodiment, the plurality of conductive portions 327 may include a first conductive portion 327a spaced apart from the first side member 313 in the second direction (+x direction or −x direction) and a second conductive portion 327b spaced apart from one end of the first conductive portion 327a.

According to an embodiment, the plurality of non-conductive portions 329 may include a first non-conductive portion 329a disposed at one end of the first conductive portion 327a and a second non-conductive portion 329b disposed between another end of the first conductive portion 327a and the second conductive portion 327b. According to an embodiment, the second conductive portion 327b may include a portion of the second side member 325 extending in the first direction and a portion of the second side member 325 extending in the second direction. According to an embodiment, the electronic device 300 may include a first slit 341 adjacent to the first conductive portion 327a of the second side member 325, a second slit 343 adjacent to the second conductive portion 327b of the second side member 325, and a third slit 345 adjacent to the third conductive portion 327c of the second side member 325. According to an embodiment, the first slit 341 and the second slit 343 may face each other and may have different lengths.

In the first state, according to an embodiment, the electronic device 300 may communicate with an external electronic device through a first-a antenna structure A1a formed by an electromagnetic connection (e.g., a coupling connection) between the first conductive portion 327a and the first side member 313. For example, the first-a antenna structure A1a may be configured to transmit and/or receive a radio signal in a frequency range of a low band. The first-a antenna structure A1a may include a low-pass filter for transmitting and/or receiving a radio signal in a frequency range (e.g., 1 GHz or less) of a low band. The low pass filter may filter signals equal to or greater than a reference value. The first conductive portion 327a may be exposed to the outside of the first housing in the second state, thereby forming an antenna in a second state.

In the electronic device according to an embodiment, the second slit 343 may be fed from the fourth feeding portion F4 to operate as a slot antenna. According to an embodiment, the second slit 343 may operate as an antenna distinguished from the first a-antenna structure A1a. For example, the first-a antenna structure A1a may be referred to as an IFA supplied to the first feeding point P1 and the first-c antenna structure A1c may be referred to as a slot antenna for transmitting and/or receiving a signal using the second slit 343. As another example, a non-conductive portion extending from the non-conductive portion filled with the second slit 343 and separating the second conductive portion 327b may be added. The second conductive portion 327b separated by the non-conductive portion may operate as an inverted-F antenna like the first-a antenna structure A1a. The first-c antenna structure A1c may be distinguished from the first-a antenna structure A1a by having a different resonant frequency from the first-a antenna structure A1a. For example, the first-c antenna structure A1c may perform a function of receiving a signal of a frequency band (e.g., a low band) different from that of the first-a antenna structure A1a (e.g., a mid-band or a high-band). The first-c antenna structure A1c may include a high-pass filter for transmitting and/or receiving a radio signal in a frequency range of a mid-band band or a high-band band. The high pass filter may filter signals equal to or greater than a reference value. As another example, the first c antenna structure A1c may perform a function for a short-range communication network such as a wireless fence (WiFi) direct or an infrared data association (IrDA).

According to an embodiment, the electronic device 300 may further include a fifth feeding portion F5. The third conductive portion 327c may be fed from the fifth feeding portion F5 to operate as an antenna. According to an embodiment, the second non-conductive portion 329b and the seventh non-conductive portion 329g may be disposed at both ends of the third conductive portion 327c. The third conductive portion 327c may be electrically connected to the fifth impedance matching circuit 430 for adjusting the resonant frequency of the antenna. For example, the antenna formed by the third conductive portion 327c may transmit and/or receive signals of a frequency band different from that of the first-a antenna structure A1a and the first-c antenna structure A1c. As another example, the antenna formed by the third conductive portion 327c may be used for multi-input and multi-output (MIMO) type communication by transmitting and/or receiving a signal of a frequency band substantially equal to the frequency band of the first-a antenna structure A1a or the frequency band of the first-c antenna structure A1c.

In the first state, according to an embodiment, the electronic device 300 may be configured to electrically short the supporting member 321 and the first housing 310 in order to ensure radiation performance of the first-a antenna structure A1a formed by the first slit 341 and the first conductive portion 327a. Referring to FIG. 19, the supporting member 321 and the first housing 310 may be shorted with each other by contacting the first housing 310 and a portion of the supporting member 321 (e.g., portion A of FIG. 19). According to an embodiment, when the supporting member 321 and the first housing 310 are electrically shorted, by the coupling of the first conductive portion 327a and the first housing 310, the flow of the current formed in the first housing 310 may include a first path L1 flowing along the second direction (+x direction or −x direction) and a second path L2 flowing along the first direction (+y direction or −y direction) from one end in the second direction. According to an embodiment, the electronic device 300 may transmit and/or receive a signal of a designated frequency band (e.g., a low band) through the first-a antenna structure A1a and transmit and/or receive a signal of a frequency band (e.g., a mid-band or a high-band) different from the designated frequency band through the first-c antenna structure A1c.

According to an embodiment, the electronic device (e.g., the electronic device 300 of FIG. 3A) may include a first housing (e.g., the first housing 310 of FIG. 3A), a second housing (e.g., the second housing 320 of FIG. 3A), a supporting member (e.g., the supporting member 321 of FIG. 4C), at least one slit (e.g., at least one slit 340 of FIG. 4A) and at least one processor (e.g., the processor 120 of FIG. 1).

The first housing 310 may include a first cover plate (e.g., the first cover plate 311 of FIG. 3B). The first housing may include a first side member (e.g., the first side member 313 of FIG. 3A) disposed along a portion of the circumference of the first cover plate. The first housing may include a conductive material.

The second housing may be coupled to the first housing to be slidable in the first housing or slidable out from the first housing in a first direction (e.g., a +y direction or a −y direction of FIG. 3A). The second housing may include a second cover plate (e.g., the second cover plate 323 of FIG. 4C). The second housing may include a second side member (e.g., the second side member 325 of FIG. 4c) disposed along a circumference of the second cover plate. The second side member may include a plurality of conductive portions (e.g., a plurality of conductive portions 327 of FIG. 4C). The second side member may include the plurality of non-conductive portions (e.g., the plurality of non-conductive portions 329 of FIG. 4C) disposed between the plurality of conductive portions. The second housing may include a feeding point (e.g., the first feeding point P1 in FIG. 5A) disposed on at least one conductive portion of the plurality of conductive portions.

The supporting member may be positioned inside the second housing.

The at least one slit may be disposed on the supporting member.

The at least one processor may be configured to communicate with an external electronic device through the first housing and the at least one conductive portion acting as an antenna (e.g. antenna A1 in the first state of FIG. 5A) in a first state in which the second housing is slid into the first housing. The at least one processor may be configured to communicate with the external electronic device through the at least one conductive portion acting as an antenna (e.g., an antenna A2 in a second state of FIG. 5B) in a second state in which the second housing is slid out from the first housing.

According to an embodiment, the at least one processor may be configured to communicate with the external electronic device using the at least one conductive portion and the first housing electromagnetically connected to the at least one conductive portion, in the first state. The at least one processor may be configured to communicate with the external electronic device using the at least one conductive portion that is electromagnetically disconnected from the first side member, in the second state.

According to an embodiment, the electronic device may further comprise an impedance matching circuit (e.g., the first impedance matching circuit 350 of FIG. 5A or the second impedance matching circuit 360 of FIG. 5B) electrically connected to the at least one conductive portion. The at least one processor may be configured to switch a resonant frequency of the antenna in the first state or a resonant frequency of the antenna in the second state by controlling the impedance matching circuit.

According to an embodiment, the impedance matching circuit may include a first impedance matching circuit (e.g., the first impedance matching circuit 350 of FIG. 5A) including a first impedance element (e.g., the first impedance element 351 of FIG. 5A) and a first switch (e.g., the first switch SW1 of FIG. 5A) electrically connectable to the first impedance element and at least one conductive portion of the plurality of conductive portions. The impedance matching circuit (e.g., a second impedance matching circuit 360 of FIG. 5B) may include a second impedance matching circuit including a second impedance element (e.g., the second impedance element 361 of FIG. 5B) and a second switch (e.g., the second switch SW2 of FIG. 5B) electrically connectable to the second impedance element and at least one conductive portion of the plurality of conductive portions. The at least one processor may be configured to adjust the resonant frequency of the antenna in the first state by controlling the first impedance matching circuit, in the first state. The at least one processor may be configured to adjust the resonant frequency of the antenna in the second state by controlling the second impedance matching circuit, in the second state.

According to an embodiment, the plurality of conductive portions (e.g., the first conductive portion 527a of FIG. 5A) may include a first conductive portion spaced apart from the first side member in a second direction (e.g., the +x direction or the −x direction of FIG. 5A) perpendicular to the first direction in the first state and exposed to the outside of the first side member in the second state. The at least one slit (e.g., the first slit 341 of FIG. 5A) may include a first slit adjacent to the first conductive portion of the second side member. The feeding point may include a first feeding point (e.g., the first feeding point P1 of FIG. 5A) disposed on the first conductive portion. The at least one processor may be configured to indirectly feed the first feeding point.

According to an embodiment, the electronic device may further comprise a first impedance matching circuit electrically connected to the first conductive portion and a second impedance matching circuit electrically connected to the first conductive portion. The at least one processor may be configured to switch the resonant frequency of the antenna in the first state or the resonant frequency of the antenna in the second state by controlling the first impedance matching circuit and the second impedance matching circuit.

According to an embodiment, the first impedance matching circuit and the second impedance matching circuit may electrically connect the first conductive portion and a ground region (e.g. the ground region G in FIG. 5A) in the second housing.

According to an embodiment, the plurality of conductive portions may include a first conductive portion spaced apart from the first side member in a second direction perpendicular to the first direction in the first state, and exposed to the outside of the first side member in the second state and a second conductive portion (e.g., the second conductive portion 327*b* of FIG. 12) facing the first conductive portion. The at least one slit may include a first slit adjacent to the first conductive portion of the second side member and a second slit (e.g., the second slit of FIG. 12 343) adjacent to the second conductive portion of the second side member. The feeding point may include a first feeding point disposed on the first conductive portion. The at least one processor may be configured to indirectly feed the first feeding point.

According to an embodiment, the feeding point (e.g., the second feeding point P2 in FIG. 12) may include a second feeding point disposed on the second conductive portion. The at least one processor may be configured to indirectly feed the first feeding point and the second feeding point.

According to an embodiment, a phase of the current applied through the first feeding point may be opposite to a phase of the current applied through the second feeding point.

According to an embodiment, the plurality of conductive portions may include a first conductive portion spaced apart from the first side member in a second direction perpendicular to the first direction in the first state and exposed to the outside of the first side member in the second state and a second conductive portion spaced apart from one end of the first conductive portion. The plurality of non-conductive portions may include a first non-conductive portion (e.g., the first non-conductive portion 329*a* of FIGS. 12A and 12B) disposed at one end of the first conductive portion and a second non-conductive portion (e.g., the second non-conductive portion 329*b* of FIGS. 12A and 12B) disposed between another end of the first conductive portion and the second conductive portion.

According to an embodiment, a length of the supporting member in the first direction may be longer than or equal to a length of the second cover plate in the first direction.

According to an embodiment, an electronic device may further comprise a connecting member (e.g., a connecting member 370 of FIG. 5A) disposed between the first housing and the second housing, and electrically connecting a ground region (e.g., a ground region G of FIG. 5A) in the second housing and the first housing.

According to an embodiment, the electronic device may further comprise a rollable display (e.g., the display of FIG. 3A 301) disposed on the supporting member. The rollable display may be rolled in the first housing or the second housing in the first state.

According to an embodiment, the electronic device may include a first housing, a second housing, a supporting member, a first conductive part, a first slit, a sensor (e.g., the sensor 380 of FIG. 6), an impedance matching circuit, and at least one processor.

The first housing may include a conductive material.

The second housing may be slidably coupled to the first housing in a first direction. The second housing may include a second cover plate and a side member. The side member may be disposed along a circumference of the second cover plate.

The supporting member may be positioned inside the second housing.

The first conductive portion may be formed along at least a portion of the side member extending in the first direction.

The first slit may be adjacent to the first conductive portion in the supporting member.

The sensor may output a signal related to the state of the electronic device.

The impedance matching circuit may be electrically connected to the first conductive portion.

The at least one processor may be operatively coupled to the impedance matching circuit and the sensor. The at least one processor may be configured to communicate with an external electronic device, based on a resonant frequency set as a first frequency, through the first conductive portion and the first housing acting as an antenna in a first state, in response to identifying the first state in which the second housing is slid in the first housing by the sensor. The at least one processor may be configured to communicate with an external electronic device, based on the resonant frequency set as a second frequency, through the first conductive portion exposed to the outside of the first housing acting as an antenna in a second state, in response to identifying the second state in which the second housing is slid out from the first housing by the sensor.

According to an embodiment, the first processor may switch the resonant frequency from the first frequency to the second frequency at least partially different from the first frequency by controlling the impedance matching circuit in response to identifying a switching from the first state to the second state, by the sensor.

According to an embodiment, the impedance matching circuit may include a plurality of impedance elements and a switch electrically connectable to the plurality of impedance elements and the first conductive portion. The at least one processor may be configured to control the resonant frequency of the antenna in the first state to the resonant frequency set as the first frequency by connecting the switch and at least one impedance element among the plurality of impedance elements in response to identifying the first state by the sensor. The at least one processor may be configured to control the resonant frequency of the antenna in the second state to the resonant frequency set as the second frequency by connecting the switch and at least one impedance element among the plurality of impedance elements in response to identifying the second state by the sensor.

According to an embodiment, the impedance matching circuit may include a first impedance matching circuit including a first impedance element and a first switch capable of electrically connecting the first impedance element and the first conductive portion. The impedance matching circuit may include a second impedance matching circuit including a second impedance element and a second switch capable of electrically connecting the second impedance element and the first conductive portion. The at least one processor may be configured to adjust the resonant frequency of the antenna in the first state by controlling the first impedance matching circuit in response to identifying the first state by the sensor. The at least one processor may be configured to adjust the resonant frequency of the antenna in the second state by controlling the second impedance matching circuit in response to identifying the second state by the sensor.

According to an embodiment, the electronic device further comprises a second conductive portion facing the first conductive portion. The electronic device further comprises a second slit adjacent to the second conductive portion by facing the first slit. The electronic device further comprises a first feeding point disposed on the first conductive portion. The at least one processor may be configured to indirectly feed the first feeding point.

According to an embodiment, the electronic device may further comprise a second feeding point disposed on the second conductive portion. The at least one processor may be configured to indirectly feed the first feeding point and the second feeding point.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or portion thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The term "non-transitory" storage medium may, for example, refer to a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a first housing including:
        a first conductive cover plate, and
        a first conductive side member including:
            a first portion surrounding a bottom side, a left side, and a right side of the first conductive cover plate,
            a second portion extending from an end of the first portion of the first conductive side member in a first direction, and
            a third portion, extending from another end of the first portion of the first conductive side member, substantially parallel to the second portion of the first conductive side member; and
    a second housing slidably coupled to the first housing in the first direction or a second direction opposite to the first direction, the second housing including: a second side member that includes a plurality of conductive portions and a plurality of non-conductive portions disposed between the plurality of conductive portions, the plurality of conductive portions including:

a first conductive portion extending to be substantially parallel to the second portion of the first conductive side member, wherein the first conductive portion of the second side member, when the electronic device is in a first state in which at least a portion of the second housing is positioned in the first housing, at least partially overlaps the second portion of the first conductive side member, and a second conductive portion extending to be substantially parallel to the first conductive portion of the second housing, wherein the second conductive portion of the second side member, when the electronic device is in the first state, at least partially overlaps the third portion of the first conductive side member, wherein the first conductive portion of the second side member is configured to, when the electronic device is in a second state in which at least the portion of the second housing is positioned out of the first housing, function as an antenna radiator, and wherein the first conductive cover plate, the first conductive side member, and the first conductive portion are configured to, when the electronic device is in the first state, function as an antenna radiator based on an inductive coupling between the first conductive portion of the second side member and the second portion of the first conductive side member.

2. The electronic device of claim 1, a first slit adjacent to the first conductive portion;

a second slit adjacent to the first conductive portion; and at least one processor comprising processing circuitry, wherein the at least one processor configured to feed, indirectly, a feeding point of the first conductive portion, wherein a radiation current is induced in the first conductive cover plate and the first conductive side member, based on the inductive coupling between the first conductive portion and the second portion of the first conductive side member.

3. The electronic device of claim 1, further comprising:

at least one processor comprising processing circuitry; and an impedance matching circuit electrically connected to the first conductive portion, wherein the at least one processor is configured to switch a resonant frequency of an antenna including the antenna radiator in the first state or a resonant frequency of an antenna including the antenna radiator in the second state by controlling the impedance matching circuit.

4. The electronic device of claim 3, wherein the impedance matching circuit includes:

a first impedance matching circuit including:

a first impedance element, and a first switch configured to electrically connect the first impedance element and the first conductive portion, and a second impedance matching circuit including:

a second impedance element, and a second switch configured to electrically connect the second impedance element and the second conductive portion, wherein the at least one processor is configured to:

adjust the resonant frequency of the antenna in the first state by controlling the first impedance matching circuit, in the first state, and adjust the resonant frequency of the antenna in the second state by controlling the second impedance matching circuit, in the second state.

5. The electronic device of claim 1, further comprising at least one processor comprising processing circuitry, wherein the at least one processor is configured to feed, indirectly, a feeding point of the first conductive portion to communicate with an external electronic device.

6. The electronic device of claim 5, further comprising:

a first impedance matching circuit electrically connected to the first conductive portion; and a second impedance matching circuit electrically connected to the first conductive portion, and wherein the at least one processor is configured to switch a resonant frequency of an antenna including the antenna radiator in the first state or a resonant frequency of an antenna including the antenna radiator in the second state by controlling the first impedance matching circuit and the second impedance matching circuit.

7. The electronic device of claim 6, wherein the first impedance matching circuit and the second impedance matching circuit are configured to electrically connect the first conductive portion and a ground region in the second housing.

8. The electronic device of claim 1, further comprising:

a first slit adjacent to the first conductive portion;

a second slit adjacent to the first conductive portion; and at least one processor comprising processing circuitry, wherein the at least one processor is configured to feed, indirectly, a first feeding point of the first conductive portion and a second feeding point of the second conductive portion, to communicate with an external electronic device.

9. The electronic device of claim 8, wherein a phase of current applied through the first feeding point is opposite to a phase of current applied through the second feeding point.

10. The electronic device of claim 9, wherein the plurality of non-conductive portions includes:

a first non-conductive portion disposed at one end of the first conductive portion, and a second non-conductive portion disposed between another end of the first conductive portion and the second conductive portion.

11. The electronic device of claim 1, wherein the first conductive portion is spaced apart from the second portion of the first conductive side member in a third direction perpendicular to the first direction, when the electronic device is in the first state, and wherein the second conductive portion is spaced apart from the third portion of the first conductive side member in the third direction, when the electronic device is in the first state.

12. The electronic device of claim 1, further comprising:

a connecting member disposed between the first housing and the second housing, and electrically connecting a ground region in the second housing and the first housing.

13. The electronic device of claim 1, further comprising:

a supporting member positioned in the second housing;

a rollable display disposed on the supporting member; and wherein the rollable display is rolled in the first housing or the second housing in the first state.

14. The electronic device of claim 2, wherein radiation current flows from the third portion of the first conductive side member, through the first portion of the first conductive side member, to the second portion of the first conductive side member.

15. The electronic device of claim 1, wherein the second conductive portion of the second side member is configured to, when the electronic device is in the second state, function as an antenna radiator, and wherein both the first conductive cover plate and the first conductive side member are configured to, when the electronic device is in the first state, function as an antenna radiator based on inductive coupling the second conductive portion of the second side member and the third portion of the first conductive side member.

16. An electronic device comprising:

a first housing including a conductive material;

a second housing slidably coupled to the first housing for sliding in a first direction, the second housing including:

a second cover plate, and a side member disposed along a circumference of the second cover plate;

a supporting member positioned inside the second housing;

a first conductive portion formed along at least a portion of the side member extending in the first direction;

a first slit adjacent to the first conductive portion in the supporting member;

a sensor that outputs a signal related to a state of the electronic device, wherein the state of the electronic device includes a first state in which at least a portion of the second housing is positioned in the first housing, and a second state in which the at least the portion of the second housing is positioned out of the first housing;

an impedance matching circuit electrically connected to the first conductive portion;

at least one processor comprising processing circuitry and operatively coupled to the impedance matching circuit and the sensor, wherein the at least one processor is configured to:

communicate with an external electronic device, based on a resonant frequency set as a first frequency, through the first conductive portion and the first housing acting as an antenna in the first state, in response to identifying the first state, by the sensor; and communicate with the external electronic device, based on the resonant frequency set as a second frequency, through the first conductive portion exposed to an outside of the first housing acting as an antenna in the second state, in response to identifying the second state, by the sensor.

17. The electronic device of claim 16, wherein the at least one processor is configured to:

switch the resonant frequency from the first frequency to the second frequency at least partially different from the first frequency by controlling the impedance matching circuit in response to identifying a switching from the first state to the second state, by the sensor.

18. The electronic device of claim 16, wherein the impedance matching circuit includes a plurality of impedance elements and a switch electrically connectable to the plurality of impedance elements and the first conductive portion, wherein the at least one processor is configured to:

control the resonant frequency of the antenna in the first state to the resonant frequency set as the first frequency by connecting the switch and at least one impedance element among the plurality of impedance elements in response to identifying the first state, by the sensor; and control the resonant frequency of the antenna in the second state to the resonant frequency set as the second frequency by connecting the switch and at least one impedance element among the plurality of impedance elements in response to identifying the second state, by the sensor.

19. The electronic device of claim 16, wherein the impedance matching circuit includes:

a first impedance matching circuit including a first impedance element and a first switch capable of electrically connecting the first impedance element and the first conductive portion; and a second impedance matching circuit including a second impedance element and a second switch capable of electrically connecting the second impedance element and the first conductive portion, wherein the at least one processor is configured to:

adjust the resonant frequency of the antenna in the first state by controlling the first impedance matching circuit in response to identifying the first state, by the sensor, adjust the resonant frequency of the antenna in the second state by controlling the second impedance matching circuit in response to identifying the second state, by the sensor.

20. The electronic device of claim 16, further comprising:

a second conductive portion facing the first conductive portion;

a second slit adjacent to the second conductive portion by facing the first slit; and a first feeding point disposed on the first conductive portion, wherein the at least one processor is configured to indirectly feed the first feeding point.

\* \* \* \* \*